(12) United States Patent
Bazarsky et al.

(10) Patent No.: US 11,393,540 B2
(45) Date of Patent: Jul. 19, 2022

(54) ADJACENT MEMORY CELL INTERFERENCE MITIGATION

(71) Applicant: Western Digital Technologies, Inc., San Jose, CA (US)

(72) Inventors: Alexander Bazarsky, Holon (IL); Eran Sharon, Rishon Lezion (IL); Idan Alrod, Herzliya (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/171,644

(22) Filed: Feb. 9, 2021

(65) Prior Publication Data

US 2022/0130466 A1 Apr. 28, 2022

Related U.S. Application Data

(60) Provisional application No. 63/105,696, filed on Oct. 26, 2020.

(51) Int. Cl.
*G11C 16/26* (2006.01)
*H01L 25/065* (2006.01)
(Continued)

(52) U.S. Cl.
CPC .......... *G11C 16/26* (2013.01); *G11C 11/5642* (2013.01); *G11C 11/5671* (2013.01); *G11C 16/0483* (2013.01); *G11C 16/08* (2013.01); *H01L 24/08* (2013.01); *H01L 25/0657* (2013.01); *H01L 2224/08145* (2013.01); *H01L 2225/06506* (2013.01); *H01L 2225/06541* (2013.01); *H01L 2225/06562* (2013.01)

(58) Field of Classification Search
None
See application file for complete search history.

(56) References Cited

U.S. PATENT DOCUMENTS

| | | | |
|---|---|---|---|
| 7,606,070 | B2 | 10/2009 | Mokhlesi |
| 7,719,874 | B2 | 5/2010 | Scheuerlein et al. |

(Continued)

FOREIGN PATENT DOCUMENTS

| | | | |
|---|---|---|---|
| JP | 2007519162 A | 7/2007 | |
| JP | 2009064440 A | 3/2009 | |

(Continued)

*Primary Examiner* — Tan T. Nguyen
(74) *Attorney, Agent, or Firm* — Vierra Magen Marcus LLP

(57) ABSTRACT

A control circuit on a control die compensates for interference caused by adjacent memory cells on target memory cells on a memory die. The compensation may be based on the data states of the adjacent memory cells. Data latches may be used to store data states of the memory cells. However, reading the target memory cells can over-write the data states of the adjacent memory cells in the data latches. The control die may store data state information for the adjacent memory cells prior to sensing the target memory cells (e.g., prior to a decoding error of a codeword in the target cells). Saving the data state information on the control die reduces storage requirements of the memory die and alleviates the need to sense the adjacent memory cells again if decoding the codeword in the target memory cells fails.

20 Claims, 21 Drawing Sheets

(51) Int. Cl.
*H01L 23/00* (2006.01)
*G11C 11/56* (2006.01)
*G11C 16/08* (2006.01)
*G11C 16/04* (2006.01)

(56) References Cited

U.S. PATENT DOCUMENTS

| | | |
|---|---|---|
| 7,751,237 B2 | 7/2010 | Alrod et al. |
| 8,154,921 B2 | 4/2012 | Mokhlesi et al. |
| 8,411,507 B2 | 4/2013 | Li |
| 9,570,185 B2 | 2/2017 | Mokhlesi |
| 9,721,652 B2 | 8/2017 | Puthenthermadam et al. |
| 10,468,117 B2 | 11/2019 | Chen et al. |
| 10,503,586 B2 | 12/2019 | Barber et al. |
| 10,573,395 B1 * | 2/2020 | Yang .................. G11C 16/0483 |
| 2008/0158949 A1 * | 7/2008 | Mui .................... G11C 11/5642 |
| | | 365/189.05 |
| 2008/0158973 A1 * | 7/2008 | Mui .................... G11C 7/1006 |
| | | 365/189.05 |
| 2010/0034022 A1 * | 2/2010 | Dutta ................ G11C 16/3418 |
| | | 365/185.18 |
| 2011/0133025 A1 * | 6/2011 | Vauchel .................. F02C 7/045 |
| | | 244/1 N |
| 2013/0155770 A1 * | 6/2013 | Hirano .................. G11C 7/227 |
| | | 365/185.18 |

FOREIGN PATENT DOCUMENTS

| | | |
|---|---|---|
| JP | 2010541119 A | 12/2010 |
| JP | 2017523587 A | 8/2017 |

* cited by examiner

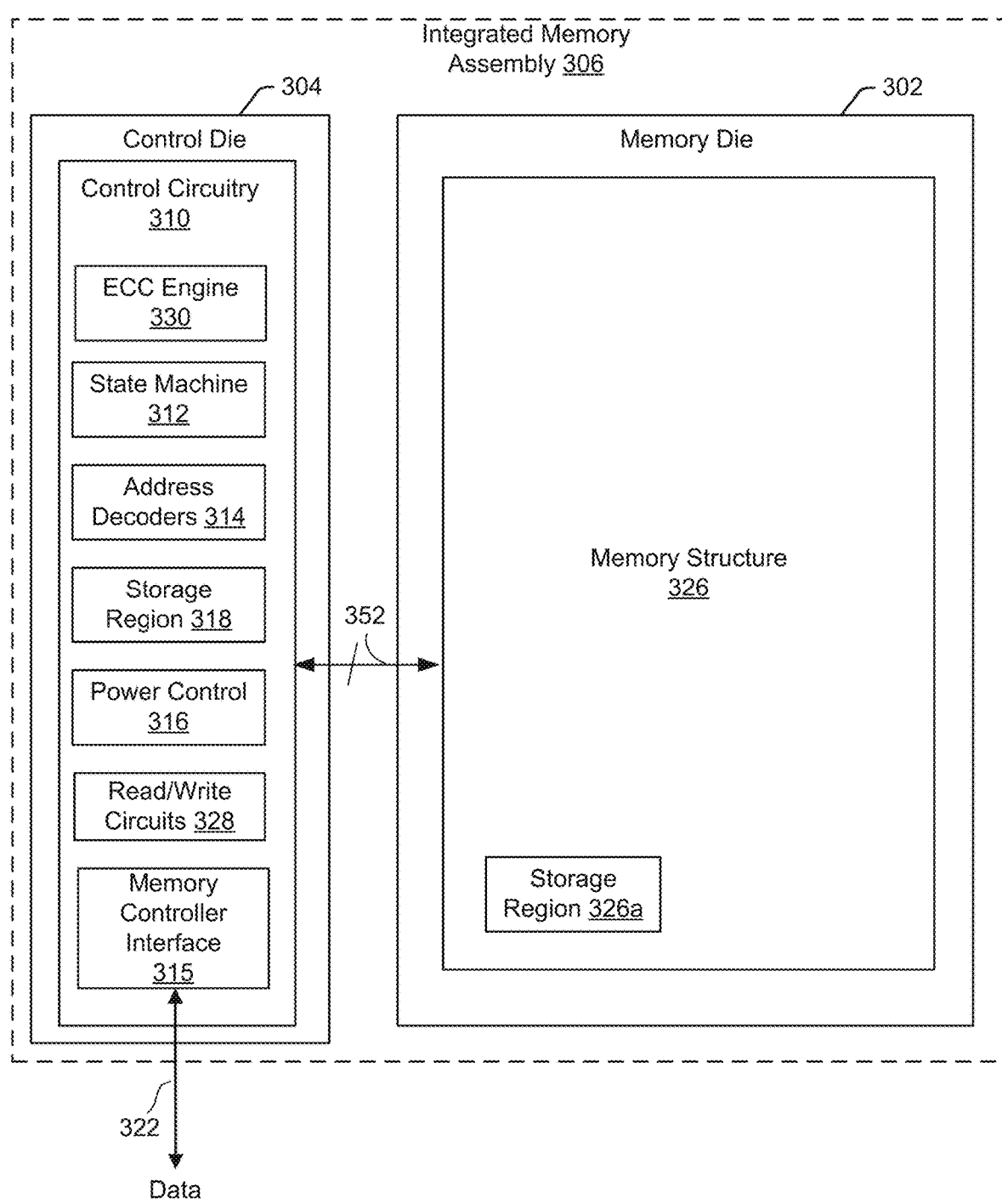

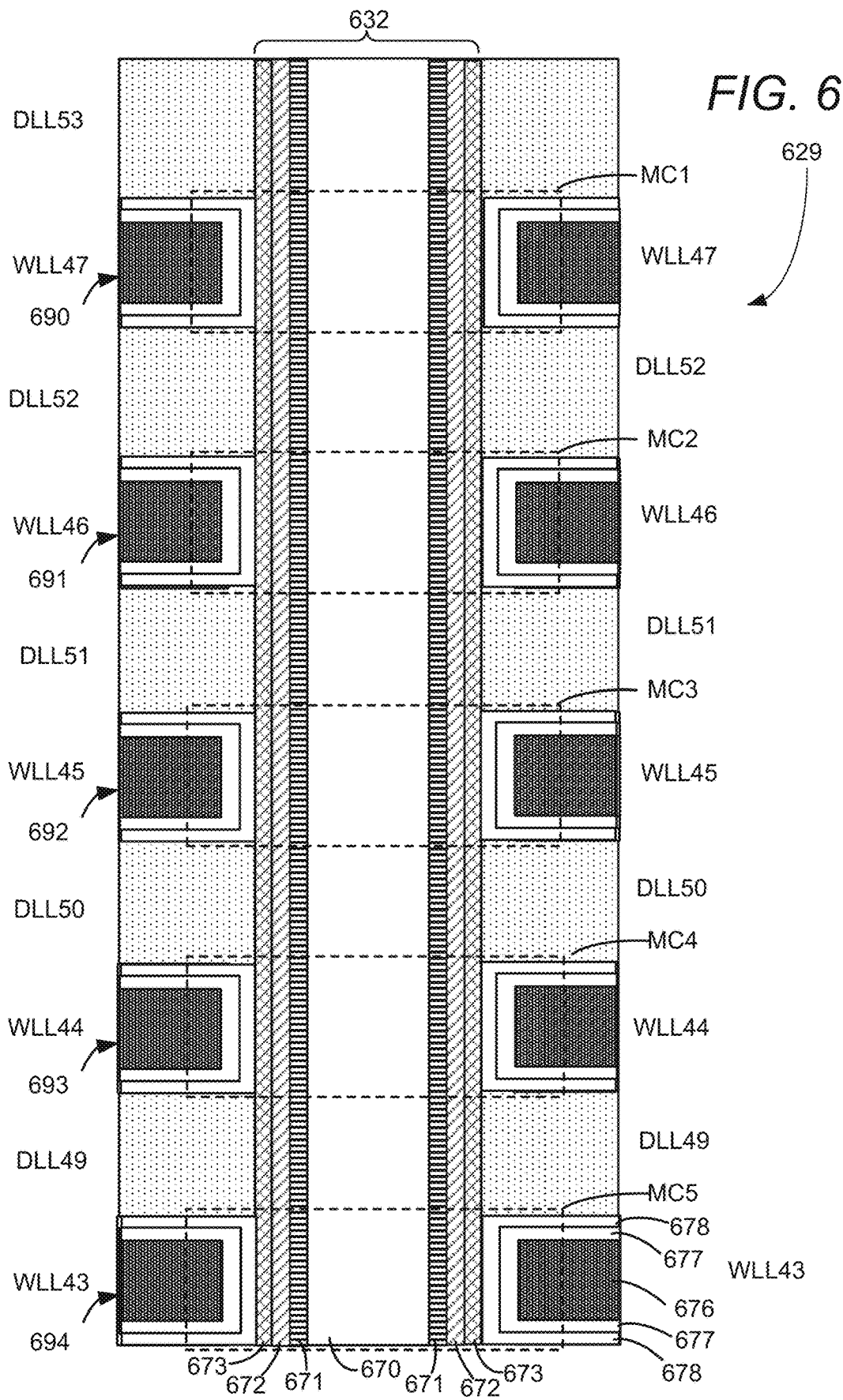

US 11,393,540 B2

ADJACENT MEMORY CELL INTERFERENCE MITIGATION

CLAIM OF PRIORITY

The present application claims priority from U.S. Provisional Patent Application No. 63/105,696, entitled "ADJACENT MEMORY CELL INTERFERENCE MITIGATION," by Bazarsky et al., filed Oct. 26, 2020, incorporated by reference herein in its entirety.

BACKGROUND

The strong growth in demand for portable consumer electronic devices is driving the need for high-capacity storage devices. Non-volatile semiconductor memory devices (also referred to herein as "non-volatile storage systems" or "non-volatile memory systems"), such as flash memory, are widely used to meet the ever-growing demands on digital information storage and exchange. Their portability, versatility and rugged design, along with their high reliability and large capacity, have made such memory devices ideal for use in a wide variety of host electronic devices, including for example digital cameras, digital music players, video game consoles, PDAs, cellular telephones, and desktop, laptop, and notepad computers. Typically, the host electronic devices provides power to the non-volatile storage system.

Non-volatile semiconductor memory devices contain non-volatile memory cells that may be programmed to store data. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. To read the data back from the memory cells it is typical to use read reference voltages in order to determine what data state a memory cell is presently in.

In addition to the gains in capacity resulting from multi-state memory architectures, consumers have seen significant advantages as a result of a history of steadily scaling down the physical dimensions of memory cells. Smaller memory cells can be packed more densely on a given die area, allowing the user to access more memory capacity for the same price as an older memory technology. In order to achieve the advantage of higher memory capacity for a fixed die size, these smaller memory cells must be packed more closely together. Doing so, however, may result in a greater number of operational errors. The errors may result in increased processing times to recover the data, or in some instances a corruption of data that has been stored.

Once a memory cell has been programmed, it is important that its programming state can be read back with a high degree of reliability. However, the sensed programming state can sometimes vary from the intended programming state due to factors including interference from an adjacent memory cell. This interference from the adjacent memory cell increases if smaller memory cells are packed more closely together.

DESCRIPTION OF THE DRAWINGS

Like-numbered elements refer to common components in the different Figures.

FIG. 3A is a functional block diagram of an embodiment of an integrated memory assembly.

FIG. 6D depicts a cross sectional view of region 629 of FIG. 6C that includes a portion of vertical column 632.

DETAILED DESCRIPTION

Figure 1A:
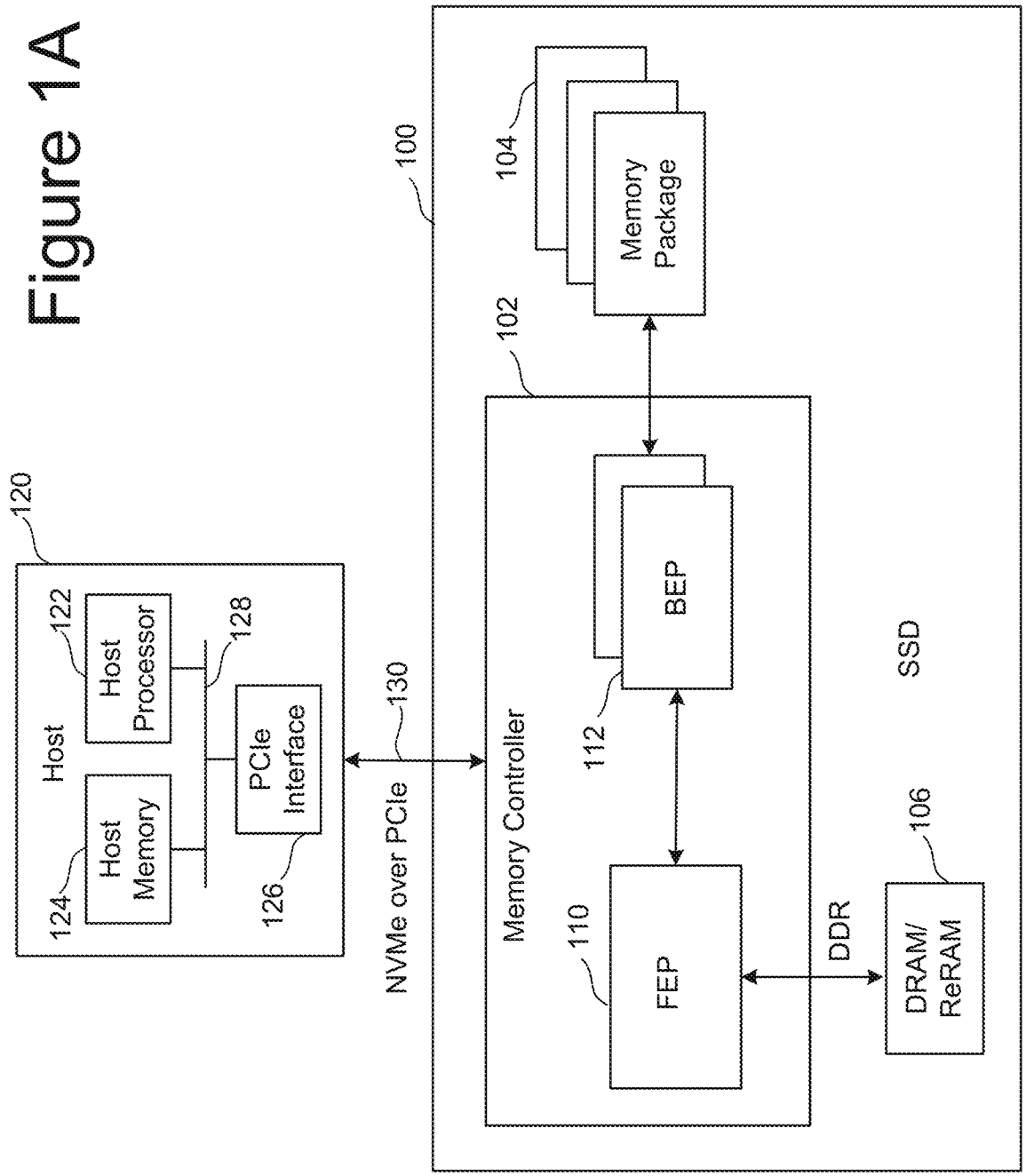
FIG. 1A is a block diagram of one embodiment of a storage system connected to a host.

The present technology will now be described with reference to the figures, which in embodiments, relate to adjacent word line interference mitigation in a non-volatile storage system. The basic unit of storage in non-volatile storage systems is a memory cell. Shifts in the apparent charge stored by a charge storage region such as charge trap layer in a target memory cell can occur because of interference based on charge stored by one or more adjacent memory cells. To account for the shift, different compensations may applied based on different possible conditions of adjacent cells.

In an embodiment, the non-volatile storage system has a memory die that contains non-volatile memory cells and a control die that contains control circuitry that provides chip-level control over memory operations (e.g., read, write, erase) of the memory cells. Placing the chip-level control circuitry on a separate die from the memory cells provides a number of advantages. A basic trade-off in an alternative design in which the memory cells and chip-level control circuitry reside on the same die is the amount of area to devote to the memory cells and the amount of area to devote to the chip-level control circuitry. Such a trade-off often leads to a need to limit functionality of the chip-level control circuitry. Also, the trade-off often results in a very limited amount of storage such as data latches, which are used for temporarily storing information from sensing memory cells.

Another advantage of placing the chip-level control circuitry on a separate die from the memory cells is that different processing technologies may be used. For example, some memory cells such as NAND use an NMOS structure, whereas chip-level control circuitry is often CMOS based. For example, chip-level control circuitry such as sense amplifier circuits, charge pumps, and logic elements in a state machine, often employ PMOS devices. Processing operations for manufacturing a CMOS die will differ in many aspects from the processing operations optimized for an NMOS NAND memory or other NMOS memory cell technologies. The memory die can be optimized for an NMOS based memory array structure, with the control die being optimized for CMOS elements and CMOS processing. Moreover, having a separate control die allows more space for the chip-level control circuitry, which can now incorporate additional capabilities that could not be readily incorporated were they restricted to the same die holding the memory cells.

In an embodiment, compensation is applied by a control circuit on a control die that is configured to connect to non-volatile memory cells on a memory die. In an embodiment, the control circuit compensates for interference caused by adjacent memory cells on target memory cells. In some embodiments, the compensation is based on the data states of the adjacent memory cells. The compensation may be performed during a sequential read in which the adjacent memory cells are read prior to reading the target memory cells. In some embodiments, data latches are used to store the data states of the memory cells. However, reading the target memory cells can over-write the data state information of the adjacent memory cells in the data latches.

The control die has a control circuit that senses the adjacent memory cells connected to a word line that is adjacent to the target word line in the memory die. The control circuit stores data state information for the adjacent memory cells based on sensing those memory cells. The control circuit determines conditions of the target non-volatile memory cells connected to the target word line based on the stored data state information. In an embodiment, the control circuit uses the stored data state information to apply compensation for interference caused by the adjacent memory cells die. In some embodiments, the data state information is used during a recovery process in which the data in the target memory cells was not successfully decoded.

Saving the data state information from the adjacent memory cells on the control die alleviates the need to sense the adjacent memory cells again if, for example, the data in the target memory cells is not successfully decoded. Hence, time is saved during a process of recovering data from the target memory cells. However, note that the saved data state information may be used during the first sensing of the target memory cells. That is, the saved data state information may be used to read the target cells without a prior failure to decode data in the target cells.

Saving the data state information from the adjacent memory cells in an architecture with both the memory cells and chip-level control circuitry on the same die can be impractical. As noted above, in such an architecture there is typically a very limited amount of space on the memory die for storage such as data latches. However, by placing the chip-level control circuitry on a separate control die, there may be more room on the control die for storage such as data latches. Hence, such storage on the control die may be used to store the data state information of the adjacent memory cells.

In some embodiments, the data latches are used to store sense information from sensing the adjacent memory cells. Then, state information for the adjacent memory cells is saved on the control die prior to sensing target memory cells in a sequential read that senses the adjacent memory cells prior to the target memory cells. When the target memory cells are sensed, the sense information from the target memory cells may overwrite the sense information from the adjacent memory cells in the data latches. However, the saved state information may be used to apply compensation when sensing the target memory cells during, for example, an error recovery process. Were the state information for the adjacent memory cells not saved, time (and power) would be used to re-read the adjacent memory cells to obtain the state information to be able to apply the compensation when sensing the target memory cells.

The control die can use the state information of the adjacent memory cells in a number of ways to apply compensation in connection with reading of data in the target memory cells. In one embodiment, the compensation includes applying different read reference voltages to a word line connected to the target memory cells, and then sensing each target memory cell for each read reference voltage. Thus, sense data for each reference voltage is initially generated for each target memory cell. The control die selects which sense data to use for each target memory cell based on the state of the adjacent memory cell. Thus, the read reference voltage may be selected to compensate for interference from the adjacent memory cell.

In one embodiment, the control die applies equalization to data that is sensed from the target memory cells, wherein the equalization is based on the state of the adjacent memory cells. The equalization may be used to compensate for interference from the adjacent memory cells. Note that the control die need not send the sensed data or the state information to, for example, a memory controller to perform the equalization.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

FIG. 1A-6D describe one example of a storage system that can be used to implement the technology disclosed herein.

FIG. 1A is a block diagram of one embodiment of a storage system 100 connected to a host 120. Storage system 100 can implement the technology disclosed herein. Many different types of storage systems can be used with the technology disclosed herein. One example storage system is a solid state drive ("SSD"); however, other types of storage systems can also be used. Storage system 100 comprises a memory controller 102, memory package 104 for storing data, and local memory (e.g. DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the integrated memory assemblies/die at the request of FEP circuit 110. In some embodiments, an integrated memory assembly is referred to as a memory package. For example, the BEP circuit 112 can carry out the read, erase and programming processes. Additionally, the BEP circuit 112 ca perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit.

In one embodiment, there are a plurality of memory package 104. Each memory package 104 may contain one or more memory dies. In one embodiment, each memory die in the memory package 104 utilizes NAND flash memory (including two dimensional NAND flash memory and/or three dimensional NAND flash memory). In other embodiments, the memory package 104 can include other types of memory; for example, the memory package can include Phase Change Memory (PCM) memory.

Memory controller 102 communicates with host 120 using an interface 130 that implements NVM Express (NVMe) over PCI Express (PCIe). For working with storage system 100, host 120 includes a host processor 122, host memory 124, and a PCIe interface 126, which communicate over bus 128. Host memory 124 is the host's physical memory, and can be DRAM, SRAM, non-volatile memory or another type of storage. Host 120 is external to and separate from storage system 100. In one embodiment, storage system 100 is embedded in host 120.

Figure 1B:
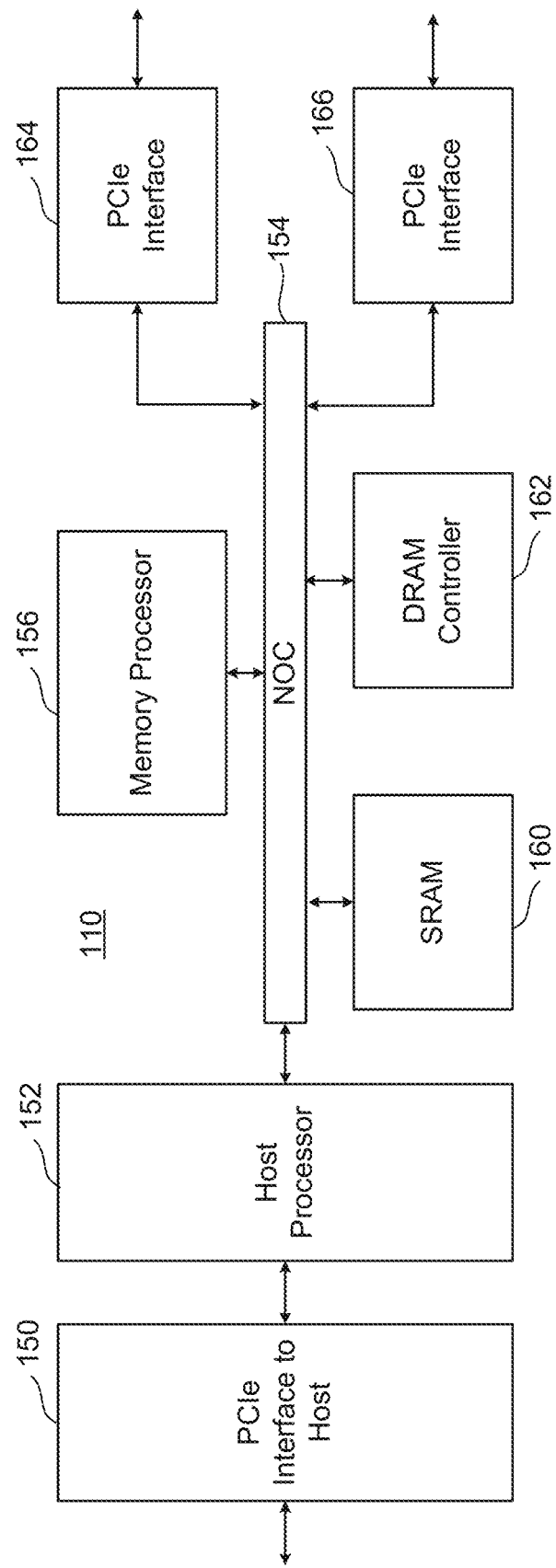
FIG. 1B is a block diagram of one embodiment of a Front End Processor Circuit.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 2A:
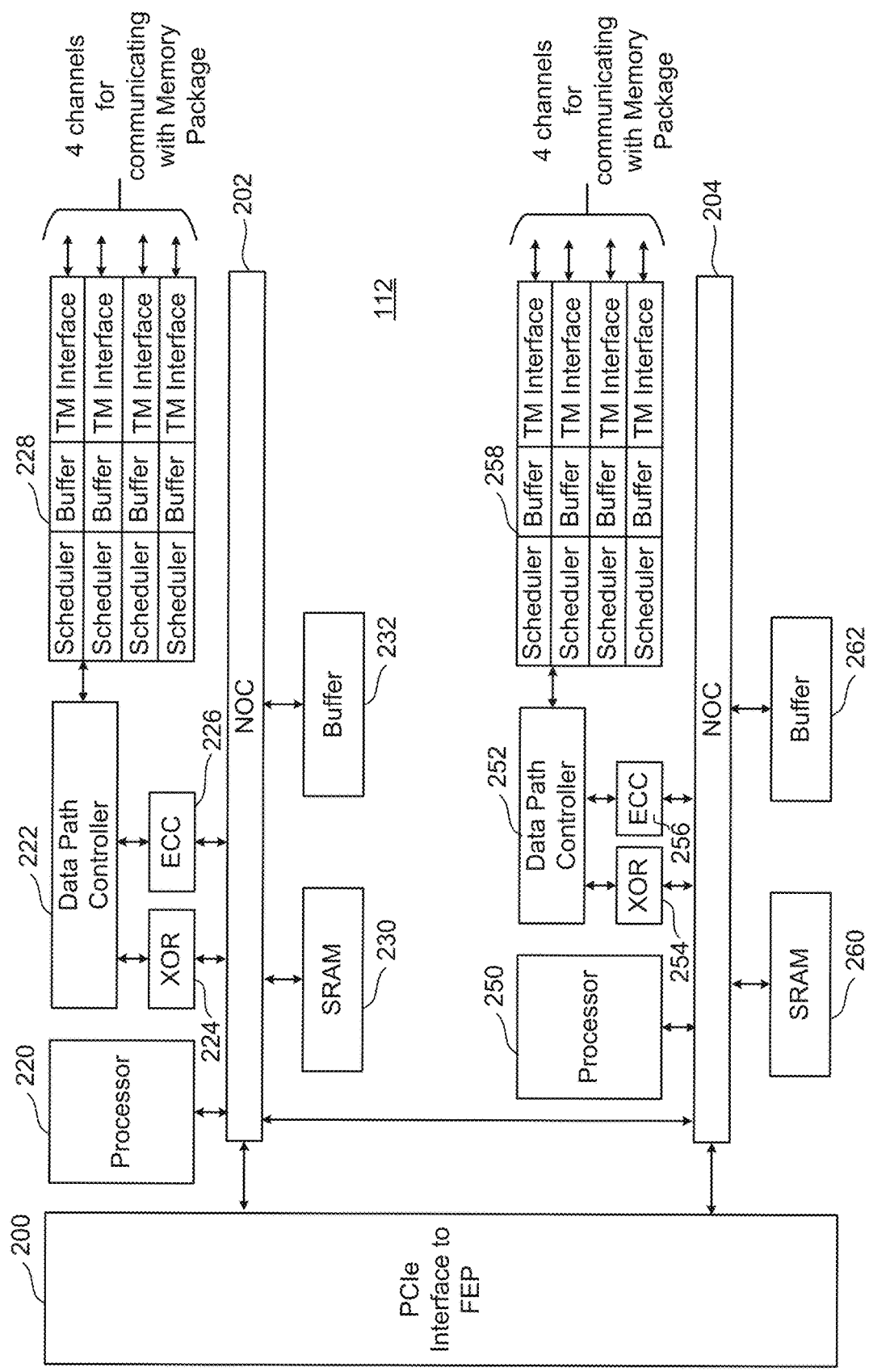
FIG. 2A is a block diagram of one embodiment of a Back End Processor Circuit.

FIG. 2A is a block diagram of one embodiment of the BEP circuit 112. FIG. 2A shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256).

The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error. In an embodiment, the XOR engines 224/254 are able to recover data that cannot be decoded using ECC engine 226/256.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2A. Additionally, controllers with structures different than FIGS. 1B and 2A can also be used with the technology described herein.

Figure 2B:
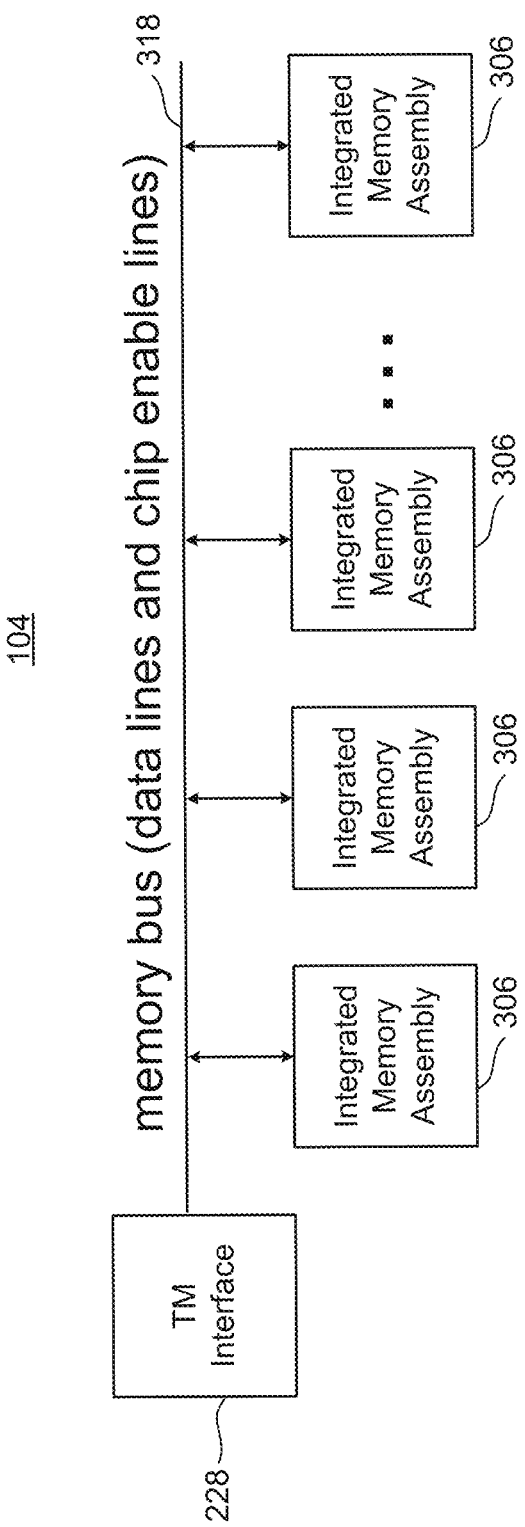
FIG. 2B is a block diagram of one embodiment of a memory package.

FIG. 2B is a block diagram of one embodiment of a memory package 104 that includes a plurality of integrated memory assemblies 306 connected to a memory bus (data lines and chip enable lines) 322. Each integrated memory assembly has a control die and one or more memory dies. The memory dies contain memory cells. The control dies contains a control circuit to perform chip-level control on a memory structure. The data bus 322 connects to a Toggle Mode Interface 228 for communicating with the TM Interface of a BEP circuit 112 (see e.g., FIG. 2A). In some embodiments, the memory package can include a small controller connected to the memory bus and the TM Interface. The memory package can have one or more integrated memory assemblies 306. In total, the memory package 104 may have eight or 16 memory die; however, other numbers of memory die can also be implemented. The technology described herein is not limited to any particular number of memory die.

FIG. 3A depicts a functional block diagram of one embodiment of an integrated memory assembly 306. The integrated memory assembly 306 may be used in a memory package 104 in storage system 100. In one embodiment, the integrated memory assembly 306 includes two types of semiconductor die (or more succinctly, "die"). Memory die 302 includes include memory structure 326. Memory structure 326 may contain non-volatile memory cells. The memory structure 326 is addressable by word lines via a row decoder (not depicted in FIG. 3A) and by bit lines via a column decoder (not depicted in FIG. 3A). The decoders may reside on either the memory die 302 or the control die 304.

Control die 304 includes control circuitry 310. The components in control circuitry 310 are electrical circuits. The control circuitry 310 is configured to perform chip-level control of the memory die. In some embodiments, the control die 304 is configured to connect to the memory structure 326 in the memory die 302. For example, the control circuitry 310 is configured to be connected to non-volatile memory cells in memory structure 326 in memory die 302. In some embodiments, the control circuitry 310 is configured to compensate for interference of adjacent memory cells on target memory cells, as disclosed herein. In some embodiments, the memory die 302 and the control die 304 are affixed (e.g., bonded) together. The control circuitry 310 includes state machine 312, an address decoder 314, a power control circuit 316, memory controller interface 315, storage region 318, and ECC engine 330. Storage region 318 may store parameters such as read reference voltages. In some embodiments, storage region 318 is used to store state information for adjacent memory cells. This state information may be used to compensate for interface of the adjacent memory cells on target memory cells, as disclosed herein.

The control circuitry 310 also includes read/write circuits 328. In another embodiment, a portion of the read/write circuits 328 are located on control die 304, and a portion of the read/write circuits 328 are located on memory die 302. The read/write circuits 328 may include multiple sense blocks and allow a page (or multiple pages) of data in multiple memory cells to be read or programmed in parallel. In one embodiment, each sense block includes a sense amplifier and a set of latches connected to the bit line. The latches store data to be written and/or data that has been read. The sense blocks include bit line drivers. In some embodiments, a portion of the latches are used to store state information from adjacent memory cells, which may be used to compensate for interference of the adjacent memory cells on target memory cells.

Commands and data are transferred between the controller 102 and the control die 304 via memory controller interface 315 (also referred to as a "communication interface"). Memory controller interface 315 is an electrical interface for communicating with memory controller 102. Examples of memory controller interface 315 include a Toggle Mode Interface and an Open NAND Flash Interface (ONFI). Other I/O interfaces can also be used. For example, memory controller interface 315 may implement a Toggle Mode Interface that connects to the Toggle Mode interfaces of memory interface 228/258 for memory controller 102. In one embodiment, memory controller interface 315 includes a set of input and/or output (I/O) pins that connect to communication channel 322 (also refers to herein as a data bus). In one embodiment, communication channel 322 connects to the memory controller 102 as part of the Toggle Mode Interface.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control module 316, a memory controller interface 315, and storage region 318. State machine 312 provides chip-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor.

The on-chip address decoder 314 provides an address interface between addresses used by controller 102 to the hardware address used by the decoders. Power control module 316 controls the power and voltages supplied to the word lines and bit lines during memory operations. Power control module 316 may include charge pumps for creating voltages.

Storage region 318 may be used to store parameters for operating the memory structure 326. Storage region 318 may include volatile or non-volatile memory. In some embodiments, the parameters include read reference voltages. The memory structure 326 has storage region 326a, which may also contain a copy of the parameters for operating the memory structure 326. In some embodiments, the parameters are copied from storage region 326a to storage region 318 when the memory die 302 is powered on.

The error correction code (ECC) engine 330 is configured to decode and error correct codewords. Herein, ECC engine 330 may be referred to as an on-die ECC engine. In one embodiment, the on-die ECC engine 330 is configured to encode data bits from the memory controller 102 into codewords that contain the data bits and parity bits. The control circuitry stores the codewords in the memory structure 326. In one embodiment, the on-die ECC engine 330 is configured to decode the codewords, which are read back from the memory structure 326. In some embodiments, the on-die ECC engine 330 is configured to compensate for interference of adjacent memory cells on target memory cells by performing equalization as described herein.

Pathways 352 are pathways between one or more components in the control circuitry 310 and the memory structure on memory die 302. A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal. A pathway may be used to provide a read reference voltage from the power control module 316 to a selected word line connected to memory cells being read in the memory structure 326. A pathway may be used to provide a read pass voltage from the power control module 316 to an unselected word line during a read operation. A pathway may connect to a bit line in the memory structure to allow the bit line to be sensed by the read/write circuits 328.

The term apparatus, as used herein may include, but is not limited to, control die 304, integrated memory assembly 306, memory package 104, storage system 100, or a host system 120 that includes a storage system 100. Any subset of components in the control circuitry 310 of control die 304 can be considered a control circuit. In another alternative, the control circuit comprises controller 102 and control circuitry 310 of control die 304 performing the functions described below in the flow charts. The control circuit can include hardware only or a combination of hardware and software (including firmware). For example, a controller programmed by firmware is one example of a control circuit. A control circuit can include a processor, PGA (Programmable Gate Array, FPGA (Field Programmable Gate Array), ASIC (Application Specific Integrated Circuit), integrated circuit or other type of circuit.

In one embodiment, memory structure 326 comprises a monolithic three-dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A storage device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a $Ge_2Sb_2Te_5$ alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 3B:
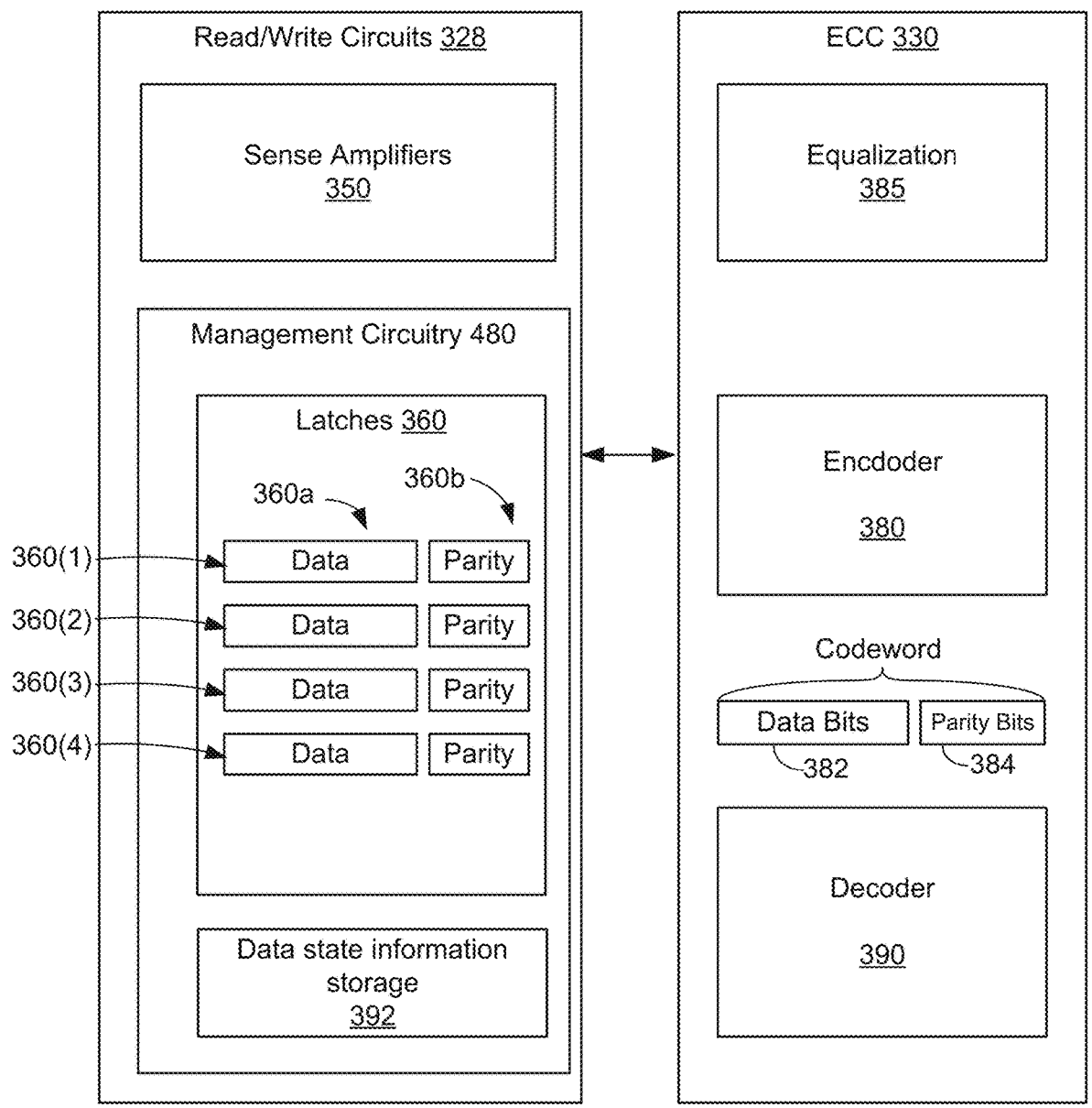
FIG. 3B is a block diagram of one embodiment of a read/write circuits and ECC of an integrated memory assembly.

FIG. 3B is a block diagram of one embodiment of the read/write circuits 328 and ECC engine 330 of the control die 304. The read/write circuits 328 includes sense amplifiers 350 and management circuitry 480. The management circuitry 480 has latches 360 and data state information storage 392. The latches 360 may include data latches 360*a* and parity latches 360*b*. In one embodiment, the data latches 360*a* store data bits of the codeword and the parity latches store parity bits of the codeword. FIG. 3B depicts four sets of data latches 360(1), 360(2), 360(3), 360(4). Each set may be used to store a codeword for a different page. In an embodiment in which four bits are stored per memory cell, four pages are stored in a set of memory cells. The four pages may be referred to as a lower page (LP), lower-middle page (LMP), upper-middle page (UMP), and an upper page (UP). In another embodiment, the sense amplifiers 350 are on the memory die 302, but the latches 360 are on the control die 304.

The data state information storage 392 is used to store data state information for memory cells. In one embodiment, storage 392 include latches, which may be similar in construction to latches 360. However, storage 392 could be a type of memory other than latches such as, for example, SRAM or DRAM. In one embodiment, the data state information is based on the information in the latches 360. As one example, the data state information is a copy of the information in the latches 360. For example, in FIG. 3B there are four bits per cell in the latches 360. Hence, storage 392 may contain a copy of these four bits for each cell. However, the data state information could contain fewer bits per memory cell than the information in the latches 360. For example, the storage 392 might contain a single bit per memory cell, which indicates which of two sets of data states the cell resides. Typically, each set is a contiguous set of data states. For example, with respect to data states S0-S15 (see FIG. 7) a bit value of "0" could specify S0-S7 and a bit value of "1" could specify S8-S15. As another example, a bit value of "0" could specify S0-S11 and a bit value of "1" could specify S12-S15. Hence, the sets do not need to be the same size. In these examples a data state information value of "0" may correspond to no compensation, whereas a data state information value of "1" may correspond to some level of compensation. The data state information could contain one, two, three, or four bits in this example in which there are 16 data states. Thus, with two bits, "00" may correspond to no compensation, whereas "01", "10" and "11" may correspond to three different levels of compensation. Herein, providing "no compensation" may be considered to be a level of compensation (e.g., zero compensation).

Note that in some embodiments, when the next set of memory cells are sensed, the information in the latches 360 may be over-written. However, the saved state information in storage 392 may be used to apply compensation to target memory cells. Hence, compensation may be applied to the target memory cells without having to re-sense the adjacent memory cells. Given the limited amount of space in an alternative architecture in which the memory cells and chip-level control circuits reside on the same die (in contrast with the integrated memory assembly 306 in FIG. 3A) it may be impractical to save the state information for the alternative architecture.

The on-die ECC engine 330 is able to encode data bits received from the memory controller 102. In one embodiment, the on-die ECC engine 330 forms codewords that each contain data bits and parity bits. In one embodiment, the memory controller 102 provides the codewords to the control die 304. The control circuitry 310 stores the codewords into non-volatile memory cells in the memory structure 326. Upon a request from the memory controller 102 to read data, the control circuitry 310 reads codewords from the memory structure 326. The on-die ECC engine 330 is also able to decode and error correct the codewords read from the memory structure 326. In some embodiments, the on-die ECC engine 330 calculates parity bits for each unit of data (e.g., page) that is being stored. The parity bits (also referred to as an error correction code) may be stored with the unit of data (e.g., page). The combination of the unit of data and its associated parity bits are referred to as a codeword. In one embodiment, the parity bits are stored remotely from the unit of data (e.g., page).

The on die ECC engine 330 includes an encoder 380, a decoder 390, and equalization 385. The encoder 380 is configured to encode data using an ECC scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The encoder 380 may form a codeword, which contains data bits 382 and parity bits 384. The data bits may be provided by the memory controller 102.

The decoder 390 is configured to decode the codewords that were stored in the memory die 302. In one embodiment, sense amplifiers 350 sense bit lines in the memory structure 326 in order to read a codeword. The sense amplifiers 350 may provide results from sensing the bit lines to the management circuitry 480. The management circuitry 480 may then determine and store raw (not yet error corrected) codewords into latches 360, based on the information from the sense amplifiers 350.

The decoder 390 is able to detect and correct errors in the raw codewords. In one embodiment, the decoder 390 implements a hard bit decoder. In one embodiment, the decoder 390 implements a soft bit decoder. The decoder 390 may implement both a hard bit decoder and a soft bit decoder. For example, the control die 304 may first attempt to decode a codeword with the hard bit decoder. If that fails, then the control die 304 may attempt to decode using the soft bit decoder.

Equalization 385 is used in one embodiment to compensate for interference from adjacent memory cells on target memory cells. The equalization 385 may be based on the information in storage 392. In one embodiment, the equalization uses Linear Minimal Mean Square Error (LMMSE) cross-coupling estimation and equalization. The equalization technique includes determining the extent to which an adjacent cell (or adjacent cells) disturbs the reading of a target cell based on a linear model of the disturbing (such as an LMMSE). Then, an estimate may be made of data that was actually stored in the target cell based on the actual sensing and the extent to which the adjacent cell(s) disturbs the reading of the target cell.

Figure 4:
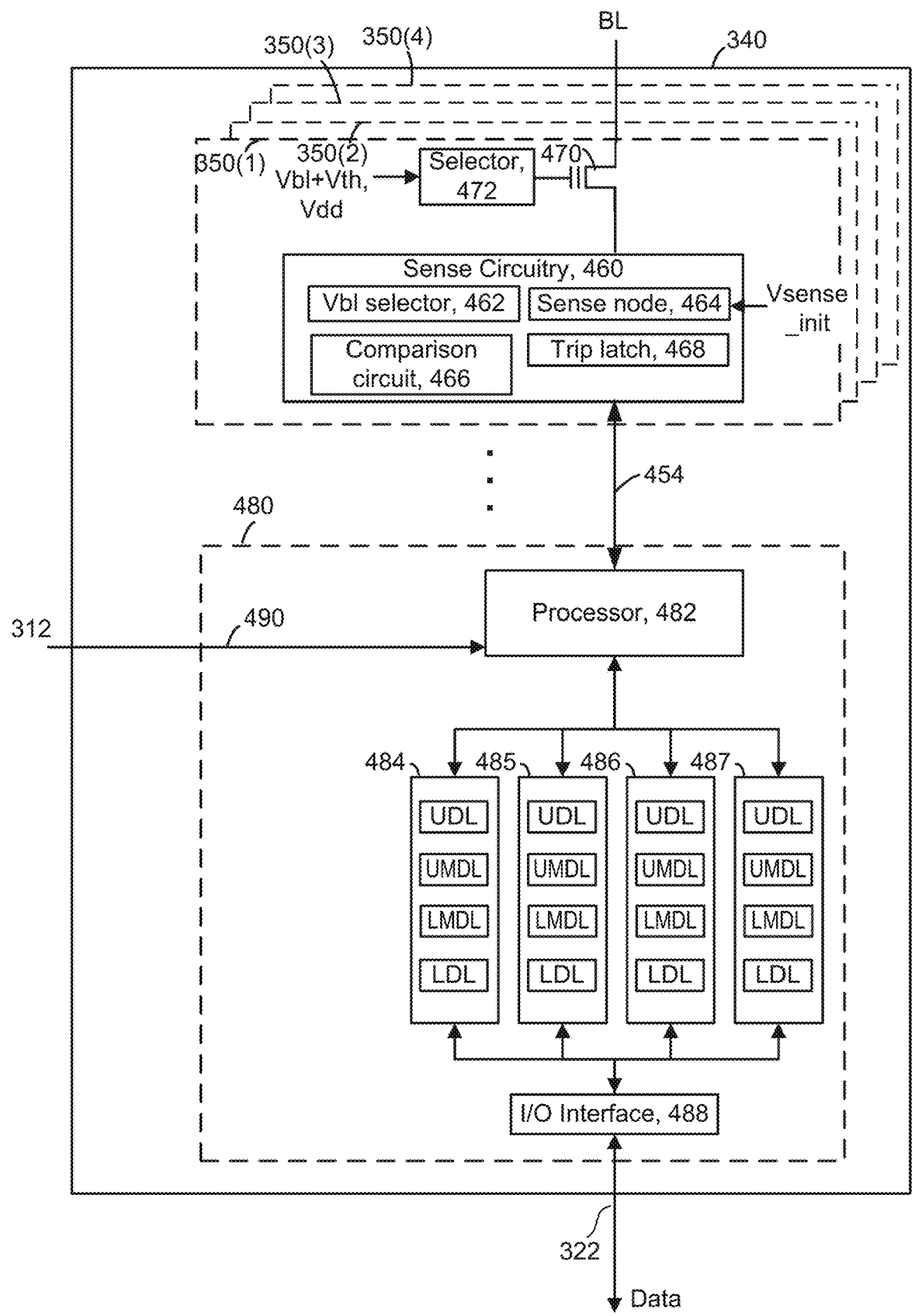
FIG. 4 is a block diagram depicting one embodiment of a sense block.

FIG. 4 is a block diagram depicting one embodiment of a sense block 340. The sense block is part of the read/write circuits 328. An individual sense block 340 is partitioned into one or more core portions, referred to as sense circuits or sense amplifiers 350(1)-350(4), and a common portion, referred to as a management circuitry 480. In one embodiment, there will be a separate sense circuit for each bit line/NAND string and one common management circuitry 480 for a set of multiple, e.g., four or eight, sense circuits. Each of the sense circuits in a group communicates with the associated managing circuit via data bus 454. Thus, there are one or more managing circuits which communicate with the sense circuits of a set of storage elements (memory cells).

The sense amplifier 350(1), as an example, comprises sense circuitry 460 that performs sensing by determining whether a conduction current in a connected bit line is above or below a predetermined threshold level. The sensing can occur in a read or verify operation. The sense circuit also supplies a bit line voltage during the application of a program voltage in a program operation. Note that other circuitry (e.g., power control 316 under control of state machine 312) may control the application of voltages to the word lines during read or program. Thus, state machine 312 may control power control 316 to control the timing of read reference voltages (as well as other voltages) to the word lines.

The sense circuitry 460 may include a Vbl selector 462, a sense node 464, a comparison circuit 466 and a trip latch 468. During the application of a program voltage, the Vbl selector 462 can pass a program enable voltage (e.g., V_pgm_enable) or a program-inhibit voltage (e.g., Vbl_inh) to a bit line connected to a memory cell.

A transistor 470 (e.g., an nMOS) can be configured as a pass gate to pass Vbl from the Vbl selector 462, by setting the control gate voltage of the transistor sufficiently high, e.g., higher than the Vbl passed from the Vbl selector. For example, a selector 472 may pass a power supply voltage Vdd, e.g., 3-4 V to the control gate of the transistor 470.

The sense amplifier 350(1) is configured to control the timing of when the voltages are applied to the bit line. During sensing operations such as read and verify operations, the bit line voltage is set by the transistor 470 based on the voltage passed by the selector 472. The bit line voltage is roughly equal to the control gate voltage of the transistor minus its Vt (e.g., 3 V). For example, if Vbl+Vt is passed by the selector 472, the bit line voltage will be Vbl. This assumes the source line is at 0 V. The transistor 470 clamps the bit line voltage according to the control gate voltage and acts as a source-follower rather than a pass gate. The Vbl selector 462 may pass a relatively high voltage such as Vdd which is higher than the control gate voltage on the transistor 470 to provide the source-follower mode. During sensing, the transistor 470 thus charges up the bit line.

In one approach, the selector 472 of each sense amplifier can be controlled separately from the selectors of other sense amplifiers, to pass Vbl or Vdd. The Vbl selector 462 of each sense amplifier can also be controlled separately from the Vbl selectors of other sense amplifiers.

During sensing, the sense node 464 is charged up to an initial voltage such as Vsense_init=3 V. The sense node is then connected to the bit line via the transistor 470, and an amount of decay of the sense node is used to determine whether a memory cell is in a conductive or non-conductive state. In one embodiment, a current that flows in the bit line discharges the sense node (e.g., sense capacitor). The length of time that the sense node is allowed to decay may be referred to herein as an "integration time." The comparison circuit 466 is used to compare the sense node voltage to a trip voltage at a sense time. If the sense node voltage decays below the trip voltage Vtrip, the memory cell is in a conductive state and its Vt is at or below the voltage of the verification signal. If the sense node voltage does not decay below Vtrip, the memory cell is in a non-conductive state and its Vt is above the voltage of the verification signal. The sense amplifier 350(1) includes a trip latch 468 that is set by the comparison circuit 466 based on whether the memory cell is in a conductive or non-conductive state. The data in the trip latch can be a bit which is read out by the processor 482.

The management circuitry 480 comprises a processor 482, four example sets of data latches 484, 485, 486, 487 and an I/O Interface 488 coupled between the sets of data latches and data bus 322 (data bus may connect to the memory controller 102). One set of data latches, e.g., comprising individual latches LDL, LMDL, UMDL, and UDL, can be provided for each sense amplifier. In some cases, fewer or additional data latches may be used. LDL stores a bit for a lower page of data, LMDL stores a bit for a lower-middle page of data, UMDL stores a bit for an upper-middle page of data, and UDL stores a bit for an upper page of data. This is in a sixteen level or four bits per memory cell memory device. In one embodiment, there are eight levels or three bits per memory cell.

The processor 482 performs computations, such as to determine the data stored in the sensed memory cell and store the determined data in the set of data latches. For example, processor 482 may determine bits in raw codewords, and store the bits of the raw codewords in latches 484-487. Each set of data latches 484-487 is used to store data bits determined by processor 482 during a read operation, and to store data bits imported from the data bus 322 during a program operation which represent write data meant to be programmed into the memory. I/O interface 488 provides an interface between data latches 484-487 and the data bus 322.

The processor 482 may also determine data state information for respective memory cells based on the information in the latches 484-487. The data state information may be saved in storage 392.

During reading, the operation of the system is under the control of state machine 312 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 482 via the data bus 454. At that point, processor 482 determines the resultant memory state by consideration of the tripping event(s) of the sense circuit and the information about the applied control gate voltage from the state machine via input lines 490. It then computes a binary encoding for the memory state and stores the resultant data bits into data latches 484-487.

Some implementations can include multiple processors 482. In one embodiment, each processor 482 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with four sense amplifiers, the state machine needs to read the wired-OR line four times, or logic is added to processor 482 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 484-487 from the data bus 322, in the LDL, LMDL, UMDL, and UDL latches, in a four-bit per memory cell implementation.

Each set of data latches 484-487 may be implemented as a stack of data latches for each sense amplifier. In some implementations, the data latches are implemented as a shift register so that the parallel data stored therein is converted to serial data for data bus 322, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

Figure 5A:
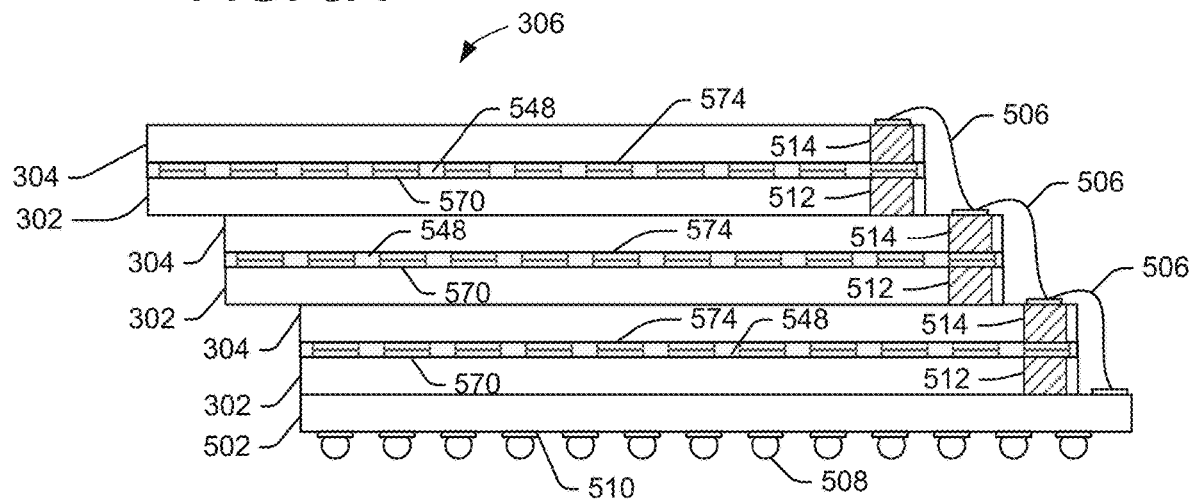
FIG. 5A depicts a side view of an embodiment of an integrated memory assembly stacked on a substrate.

In some embodiments, there is more than one control die 304 and more than one memory die 302 in an integrated memory assembly 306. In some embodiments, the integrated memory assembly 306 includes a stack of multiple control die 304 and multiple memory die 302. FIG. 5A depicts a side view of an embodiment of an integrated memory assembly 306 stacked on a substrate 502 (e.g., a stack comprising control dies 304 and memory dies 302). The integrated memory assembly 306 has three control dies 304 and three memory dies 302. In some embodiments, there are more than three memory dies 302 and more than three control die 304.

Each control die 304 is affixed (e.g., bonded) to at least one of the memory dies 302. Some of the bond pads 570, 574, are depicted. There may be many more bond pads. A space between two dies 302, 304 that are bonded together is filled with a solid layer 548, which may be formed from epoxy or other resin or polymer. This solid layer 548 protects the electrical connections between the dies 302, 304, and further secures the dies together. Various materials may be used as solid layer 548, but in embodiments, it may be Hysol epoxy resin from Henkel Corp., having offices in California, USA.

The integrated memory assembly 306 may for example be stacked with a stepped offset, leaving the bond pads at each level uncovered and accessible from above. Wire bonds 506 connected to the bond pads connect the control die 304 to the substrate 502. A number of such wire bonds may be formed across the width of each control die 304 (i.e., into the page of FIG. 5A).

A memory die through silicon via (TSV) 512 may be used to route signals through a memory die 302. A control die through silicon via (TSV) 514 may be used to route signals through a control die 304. The TSVs 512, 514 may be formed before, during or after formation of the integrated circuits in the semiconductor dies 302, 304. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 508 may optionally be affixed to contact pads 510 on a lower surface of substrate 502. The solder balls 508 may be used to electrically and mechanically couple the integrated memory assembly 306 to a host device such as a printed circuit board. Solder balls 508 may be omitted where the integrated memory assembly 306 is to be used as an LGA package. The solder balls 508 may form a part of the interface between the integrated memory assembly 306 and the memory controller 102.

Figure 5B:
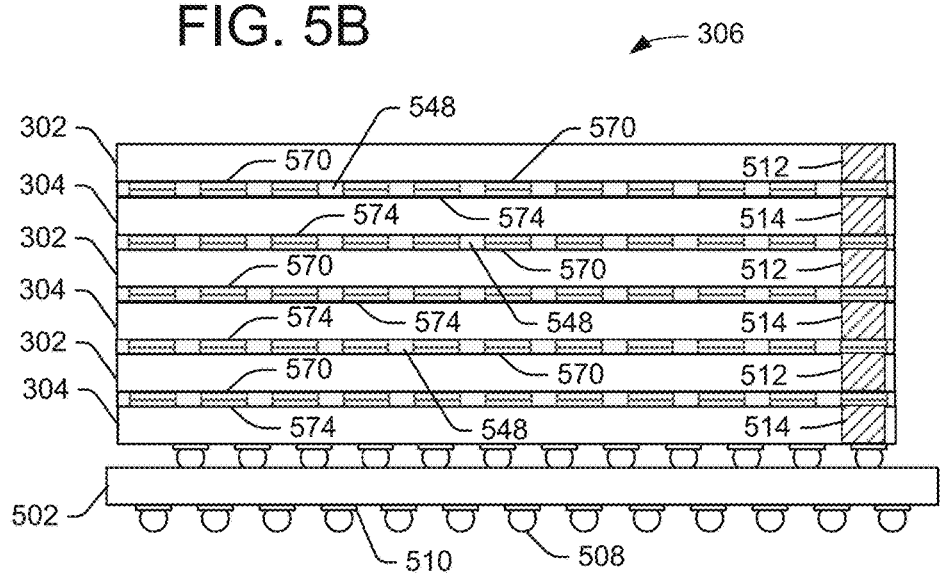
FIG. 5B depicts a side view of an embodiment of an integrated memory assembly stacked on a substrate.

FIG. 5B depicts a side view of an embodiment of an integrated memory assembly 306 stacked on a substrate 502. The integrated memory assembly 306 has three control die 304 and three memory die 302. In some embodiments, there are many more than three memory die 302 and many more than three control die 304. In this example, each control die 304 is bonded to at least one memory die 302. Optionally, a control die 304 may be bonded to two memory die 302.

Some of the bond pads 570, 574 are depicted. There may be many more bond pads. A space between two dies 302, 304 that are bonded together is filled with a solid layer 548, which may be formed from epoxy or other resin or polymer. In contrast to the example in FIG. 5A, the integrated memory assembly 306 in FIG. 5B does not have a stepped offset. A memory die through silicon via (TSV) 512 may be used to route signals through a memory die 302. A control die through silicon via (TSV) 514 may be used to route signals through a control die 304.

Solder balls 508 may optionally be affixed to contact pads 510 on a lower surface of substrate 502. The solder balls 508 may be used to electrically and mechanically couple the integrated memory assembly 306 to a host device such as a printed circuit board. Solder balls 508 may be omitted where the integrated memory assembly 306 is to be used as an LGA package.

As has been briefly discussed above, the control die 304 and the memory die 302 may be bonded together. Bond pads on each die 302, 304 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 302, 304. Where no such film is initially provided, a space between the dies may be under filled with an epoxy or other resin or polymer. The under-fill material may be applied as a liquid which then hardens into a solid layer. This under-fill step protects the electrical connections between the dies 302, 304, and further secures the dies together. Various materials may be used as under-fill material, but in embodiments, it may be Hysol epoxy resin from Henkel Corp., having offices in California, USA.

Figure 6:
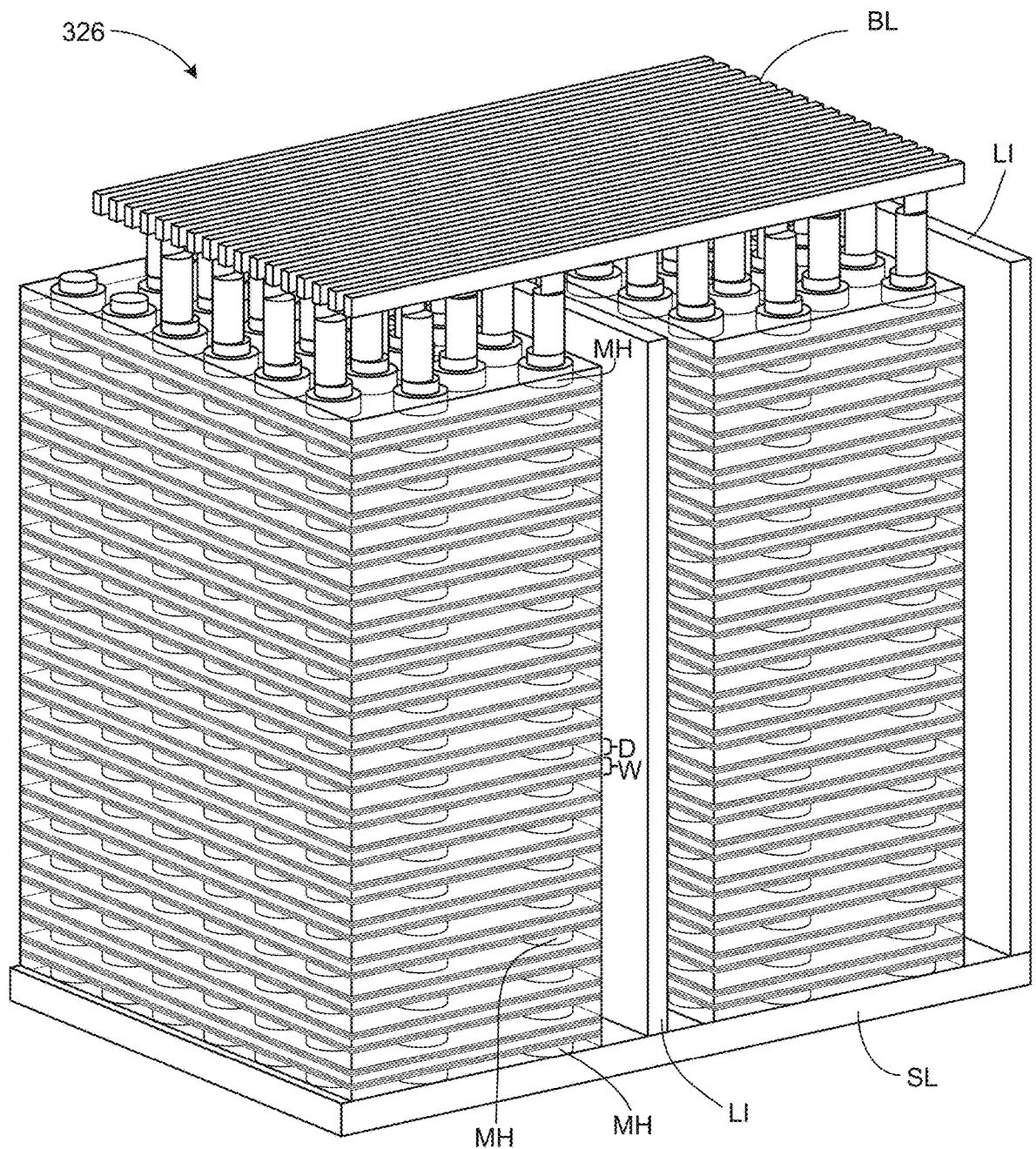
FIG. 6 is a perspective view of a portion of one example embodiment of a monolithic three dimensional memory array that can comprise memory structure.

FIG. 6 is a perspective view of a portion of one example embodiment of a monolithic three dimensional memory array that can comprise memory structure 326, which includes a plurality non-volatile memory cells. For example, FIG. 6 shows a portion of one block comprising memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The word line layers contain one or more word lines that are connected to memory cells. For example, a word line may be connected to a control gate of a memory cell. The number of alternating dielectric layers and conductive layers can vary based on specific implementation requirements. One set of embodiments includes between 108-304 alternating dielectric layers and conductive layers. One example embodiment includes 96 data word line layers, 8 select layers, 6 dummy word line layers and 110 dielectric layers. More or fewer than 108-304 layers can also be used. The alternating dielectric layers and conductive layers are divided into four "fingers" or sub-blocks by local interconnects LI, in an embodiment. FIG. 6 shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 6, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data. More details of the three dimensional monolithic memory structure 326 is provided below with respect to FIGS. 6A-6D.

Figure 6A:
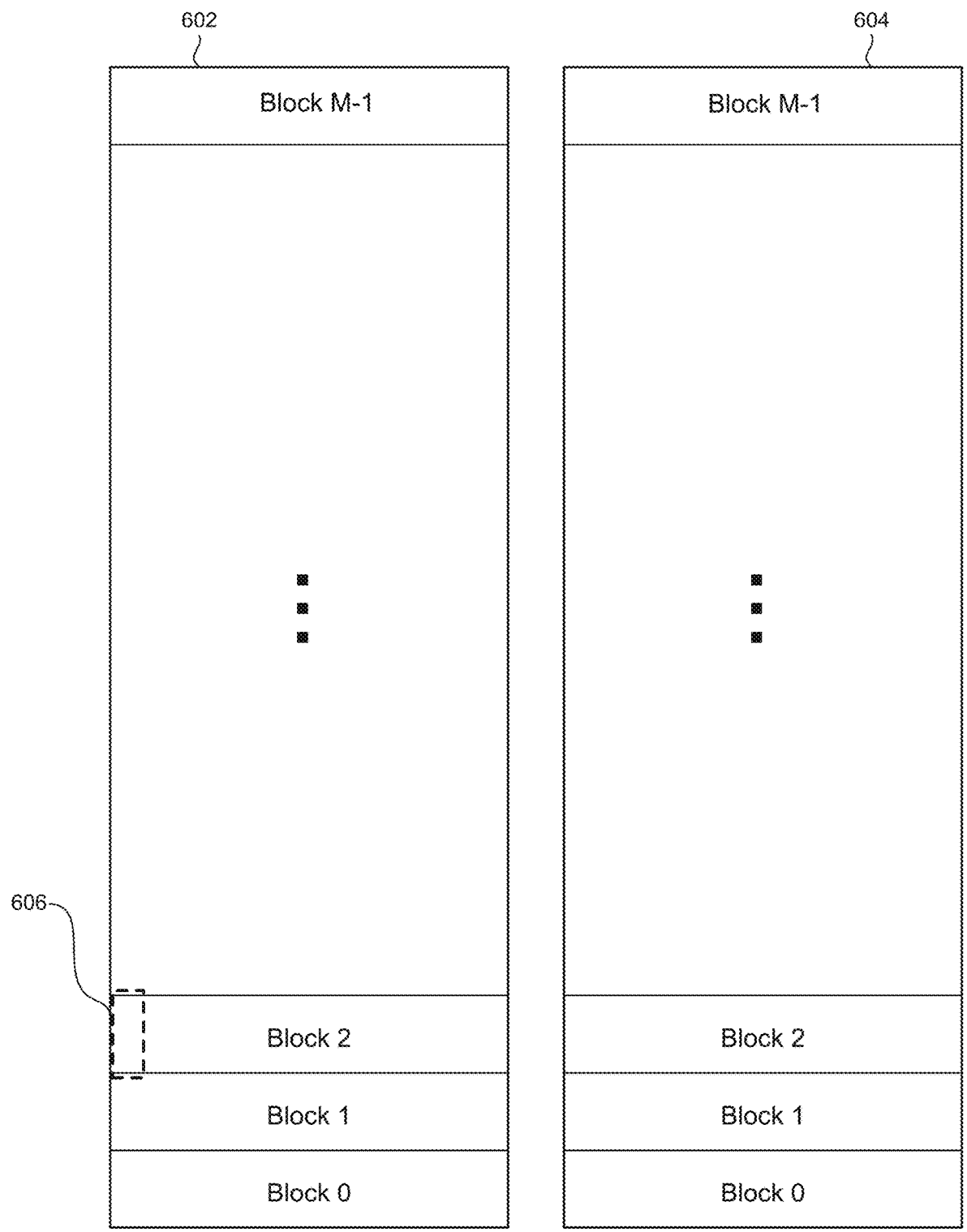
FIG. 6A is a block diagram explaining one example organization of memory structure.

FIG. 6A is a block diagram explaining one example organization of memory structure 326, which is divided into two planes 602 and 604. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 602 includes block 0, 2, 4, 6, . . . and plane 604 includes blocks 1, 3, 5, 7, . . . In on embodiment, a block of memory cells is a unit of erase. That is, all memory cells of a block are erased together. In other embodiments, memory cells can be grouped into blocks for other reasons, such as to organize the memory structure 326 to enable the signaling and selection circuits.

Figure 6B:
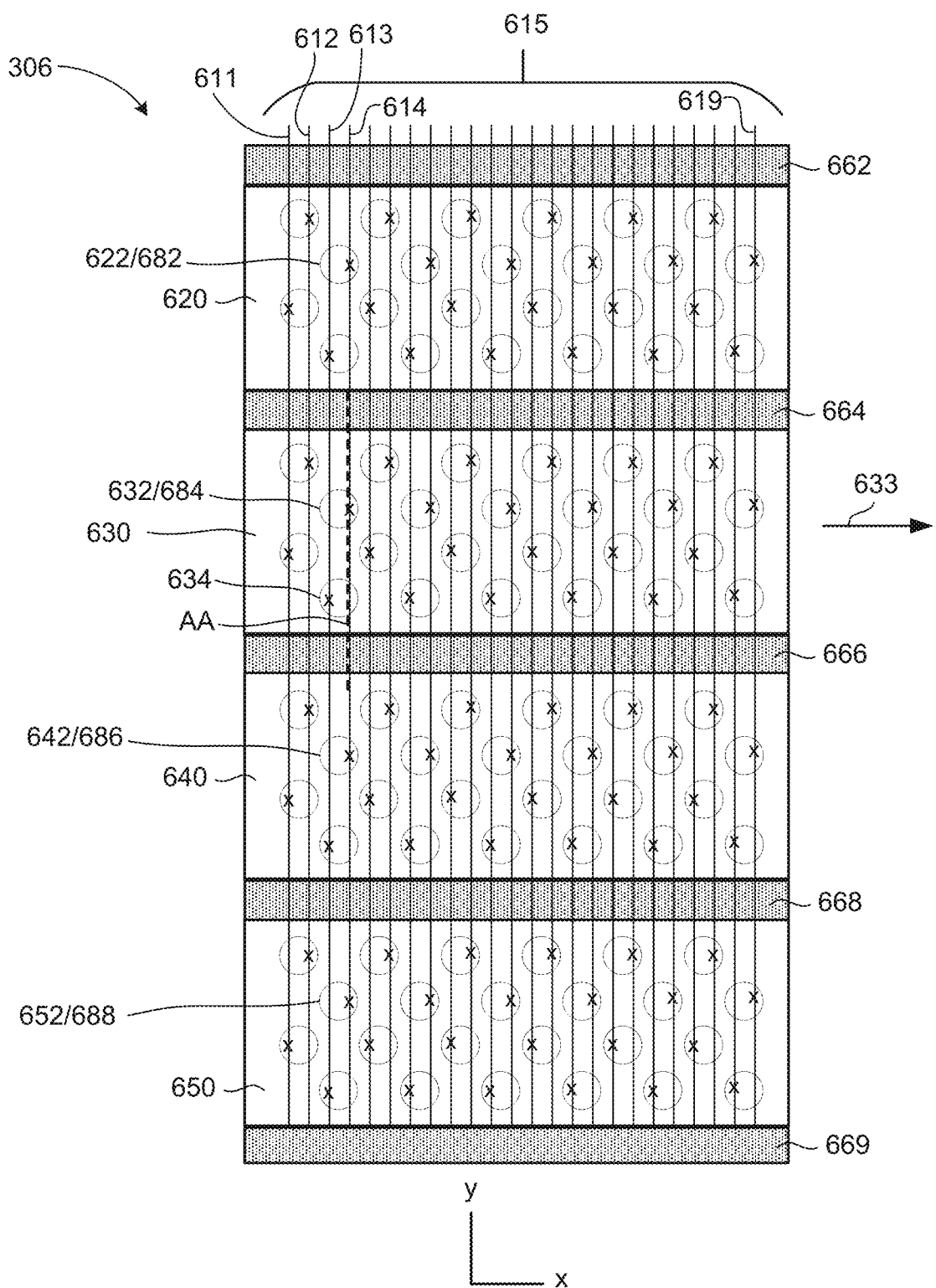
FIG. 6B is a block diagram depicting a top view of a portion of one block from memory structure.
Figure 6C:
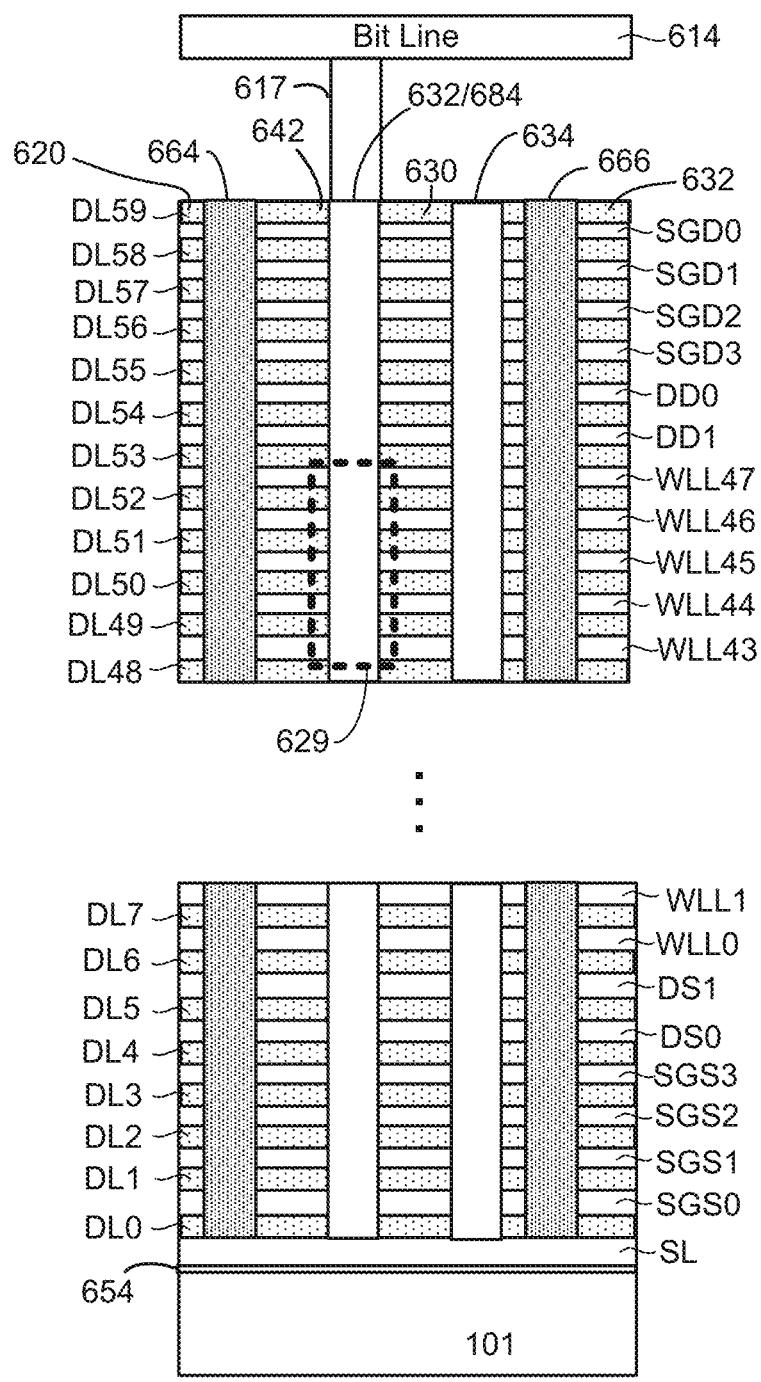
FIG. 6C depicts a portion of an embodiment of three dimensional memory structure showing a cross-sectional view along line AA of FIG. 6B.

FIGS. 6B-6D depict an example 3D NAND structure. FIG. 6B is a block diagram depicting a top view of a portion of one block from memory structure 326. The portion of the block depicted in FIG. 6B corresponds to portion 606 in block 2 of FIG. 6A. As can be seen from FIG. 6B, the block depicted in FIG. 6B extends in the direction of 633. In one embodiment, the memory array will have 60 layers. Other embodiments have less than or more than 60 layers. However, FIG. 6B only shows the top layer.

FIG. 6B depicts a plurality of circles that represent the vertical columns. Each of the vertical columns include multiple select transistors and multiple memory cells. In one embodiment, each vertical column implements a NAND string. For example, FIG. 6B depicts vertical columns 622, 632, 642 and 652. Vertical column 622 implements NAND string 682. Vertical column 632 implements NAND string 684. Vertical column 642 implements NAND string 686. Vertical column 652 implements NAND string 688. More details of the vertical columns are provided below. Since the block depicted in FIG. 6B extends in the direction of arrow 633 and in the direction of arrow 633, the block includes more vertical columns than depicted in FIG. 6B.

FIG. 6B also depicts a set of bit lines 615, including bit lines 611, 612, 613, 614, . . . 619. FIG. 6B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 614 is connected to vertical columns 622, 632, 642 and 652.

The block depicted in FIG. 6B includes a set of local interconnects 662, 664, 666, 668 and 669 that connect the various layers to a source line below the vertical columns. Local interconnects 662, 664, 666, 668 and 669 also serve to divide each layer of the block into four regions; for example, the top layer depicted in FIG. 6B is divided into regions 620, 630, 640 and 650, which are referred to as fingers or sub-blocks. In the layers of the block that implement memory cells, the four regions are referred to as word line sub-blocks that are separated by the local interconnects. In one embodiment, the word line sub-blocks on a common level of a block connect together at the end of the block to form a single word line. In another embodiment, the word line sub-blocks on the same level are not connected together. In one example implementation, a bit line only connects to one vertical column in each of regions 620, 630, 640 and 650. In that implementation, each block has sixteen rows of active columns and each bit line connects to four rows in each block. In one embodiment, all of four rows connected to a common bit line are connected to the same word line (via different word line sub-blocks on the same level that are connected together); therefore, the system uses the source side select lines and the drain side select lines to choose one (or another subset) of the four to be subjected to a memory operation (program, verify, read, and/or erase).

Although FIG. 6B shows each region having four rows of vertical columns, four regions and sixteen rows of vertical columns in a block, those exact numbers are an example implementation. Other embodiments may include more or fewer regions per block, more or fewer rows of vertical columns per region and more or fewer rows of vertical columns per block.

FIG. 6B also shows the vertical columns being staggered. In other embodiments, different patterns of staggering can be used. In some embodiments, the vertical columns are not staggered.

FIG. 6C depicts a portion of an embodiment of three dimensional memory structure 326 showing a cross-sectional view along line AA of FIG. 6B. This cross sectional view cuts through vertical columns 632 and 634 and region 630 (see FIG. 6B). The structure of FIG. 6C includes four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or less than four drain side select layers, more or less than four source side select layers, more or fewer than four dummy word line layers, and more or fewer than forty eight word line layers (e.g., 96 word line layers). Vertical columns 632 and 634 are depicted protruding through the drain side select layers, source side select layers, dummy word line layers and word line layers. In one embodiment, each vertical column comprises a NAND string. For example, vertical column 632 comprises NAND string 684. Below the vertical columns and the layers listed below is substrate 101, an insulating film 654 on the substrate, and source line SL. The NAND string of vertical column 632 has a source end at a bottom of the stack and a drain end at a top of the stack. As in agreement with FIG. 6B, FIG. 6C show vertical column 632 connected to Bit Line 614 via connector 617. Local interconnects 664 and 666 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

In some embodiments, the word lines are read sequentially, which means that the word lines are read either from low to high (e.g., WLL0 to WLL47) or from high to low (e.g., WLL47 to WLL0). It is not required to read the entire set of word lines when reading sequentially. Techniques are disclosed herein for providing compensation for interference caused by adjacent memory cells on target memory cells during a sequential read.

In some embodiments, the read of an individual word line is broken down into separate reads of sub-blocks. Referring again to FIG. 6B, the block is divided into four sub-blocks 620, 630, 640, 650. Thus, the four sub-blocks on one word line layer may be read, prior to reading the four sub-blocks on an adjacent word line layer. In some embodiments, data state information is used to provide compensation on a sub-block basis. For example, data state information for memory cells at WLL35 is kept for each of the four sub-blocks 620-650. Then, when reading sub-block 620 at WLL36 the data state information for sub-block 620 at WLL35 is used to compensate for interference from adjacent memory cells in sub-block 620 at WLL35, when reading sub-block 630 at WLL36 the data state information for sub-block 630 at WLL35 is used to compensate for interference from adjacent memory cells in sub-block 620 at WLL35, etc.

FIG. 6D depicts a cross sectional view of region 629 of FIG. 6C that includes a portion of vertical column 632. In one embodiment, the vertical columns are round and include four layers; however, in other embodiments more or less than four layers can be included and other shapes can be used. In one embodiment, vertical column 632 includes an inner core layer 670 that is made of a dielectric, such as $SiO_2$. Other materials can also be used. Surrounding inner core 670 is polysilicon channel 671. Materials other than polysilicon can also be used. Note that it is the channel 671 that connects to the bit line. Surrounding channel 671 is a tunneling dielectric 672. In one embodiment, tunneling dielectric 672 has an ONO structure. Surrounding tunneling dielectric 672 is charge trapping layer 673, such as (for example) Silicon Nitride. Other memory materials and structures can also be used. The technology described herein is not limited to any particular material or structure.

FIG. 6D depicts dielectric layers DLL49, DLL50, DLL51, DLL52 and DLL53, as well as word line layers WLL43, WLL44, WLL45, WLL46, and WLL47. Each of the word line layers includes a word line region 676 surrounded by an aluminum oxide layer 677, which is surrounded by a blocking oxide ($SiO_2$) layer 678. The physical interaction of the word line layers with the vertical column forms the memory cells. Thus, a memory cell, in one embodiment, comprises channel 671, tunneling dielectric 672, charge trapping layer 673, blocking oxide layer 678, aluminum oxide layer 677 and word line region 676. For example, word line layer WLL47 and a portion of vertical column 632 comprise a memory cell MC1. Word line layer WLL46 and a portion of vertical column 632 comprise a memory cell MC2. Word line layer WLL45 and a portion of vertical column 632 comprise a memory cell MC3. Word line layer WLL44 and a portion of vertical column 632 comprise a memory cell MC4. Word line layer WLL43 and a portion of vertical column 632 comprise a memory cell MC5. In other architectures, a memory cell may have a different structure; however, the memory cell would still be the storage unit.

When a memory cell is programmed, electrons are stored in a portion of the charge trapping layer 673 which is associated with the memory cell. These electrons are drawn into the charge trapping layer 673 from the channel 671, through the tunneling dielectric 672, in response to an appropriate voltage on word line region 676. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 7:
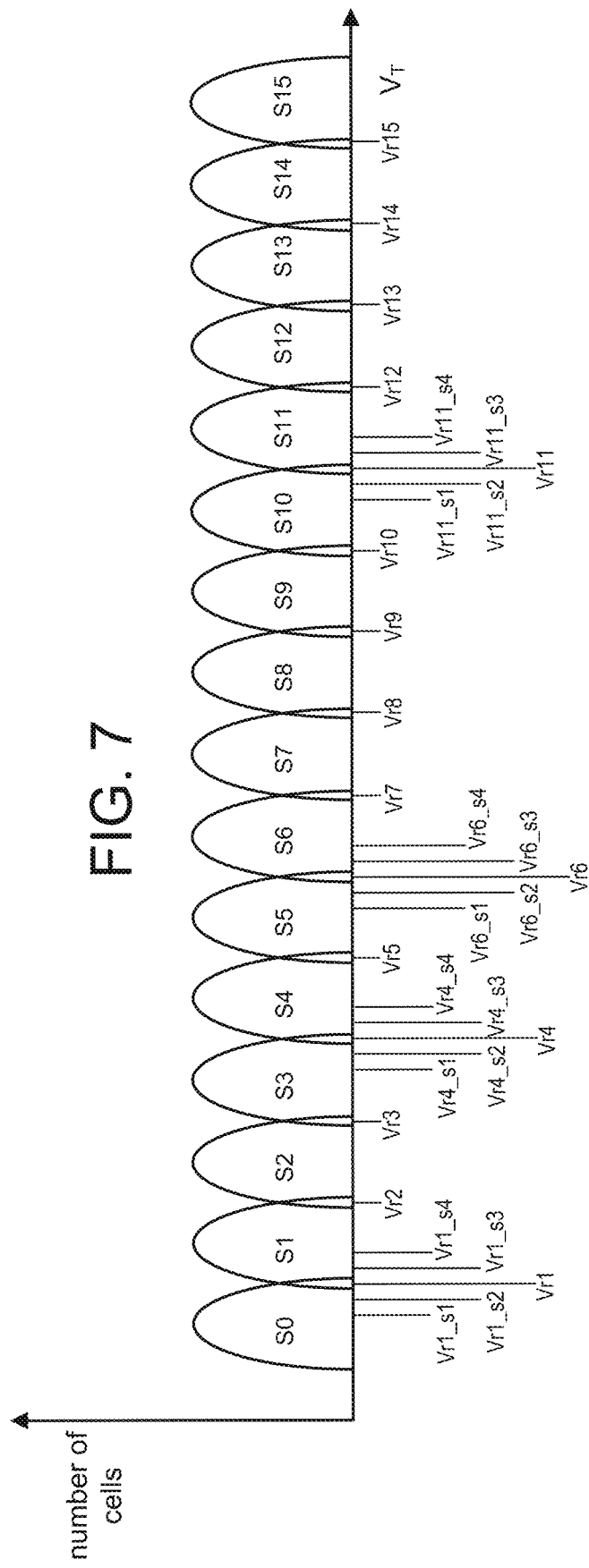
FIG. 7 illustrates example threshold voltage distributions for the memory array when each memory cell stores four bits of data.

At the end of a successful programming process, the threshold voltages of the memory cells should be within one or more distributions of threshold voltages for programmed memory cells or within a distribution of threshold voltages for erased memory cells, as appropriate. FIG. 7 illustrates example threshold voltage distributions for the memory array when each memory cell stores four bits of data. Other embodiments, however, may use other data capacities per memory cell (e.g., such as one, two, three, or five bits of data per memory cell). FIG. 7 shows 15 hard bit (HB) read reference voltages, Vr1-Vr15 for reading data from memory cells. The set of memory cells may be connected to the same word line. Each HB read reference level is used to distinguish between two adjacent threshold voltage distributions. Stated another way, each HB read reference level is used to distinguish between two adjacent data states. For example, HB read reference level Vr4 is used to distinguish between data states S3 and S4. By testing (e.g., performing sense operations) whether the threshold voltage of a given memory cell is above or below the 15 read reference voltages, the system can determine what data state (i.e., S0, S1, S2, S3 . . . ) a memory cell is in.

FIG. 7 depicts that there may be some overlap between the data states S0-S15. The overlap may occur due to factors such as memory cells losing charge (and hence dropping in threshold voltage). FIG. 7 depicts an example in which four bits are stored per memory cell. Thus, four pages may be stored in a set of memory cells. The set of memory cells may be connected to the same word line. These pages may be referred to as a lower page, lower-middle page, upper-middle page, and upper page. In one embodiment, in order to read the lower page, the memory cells are sensed using four different HB read reference voltages. For example, the memory cells may be sensed at Vr1, Vr4, Vr6, and Vr11.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 7 also depicts soft bit (SB) reference voltages associated with four of the HB reference voltages. There is one set of SB reference voltages grouped around each of Vr1, Vr4, Vr6, and Vr11. For example, the set of SB reference voltages Vr1_s1, Vr1_s2, Vr1_s3, and Vr1_s4 are grouped around HB reference voltages Vr1; the set of SB reference levels Vr4_s1, Vr4_s2, Vr4_s3, and Vr4_s4 are grouped around HB reference voltages Vr4; the set of SB reference levels Vr6_s1, Vr6_s2, Vr6_s3, and Vr6_s4 are grouped around HB reference voltages Vr6; and the set of SB reference levels Vr11_s1, Vr11_s2, Vr11_s3, and Vr11_s4 are grouped around HB reference voltages Vr11. There may be SB reference voltages associated with the other HB reference voltages, but they are not depicted in FIG. 7. In FIG. 7, there are four SB reference voltages associated with each corresponding HB reference voltage, but there could be more or fewer SB reference levels associated with a HB reference voltage.

Note that although some embodiments disclosed herein are directed to memory cells in which the state is represented by a threshold voltage (Vt) of the memory cell, the state of the memory cell may be represented by another physical parameter including, but not limited to, resistance or conductance. For example, in FIG. 7, the data states are represented by Vt distributions. However, for other types of memory cells the data states may be represented by resistance distributions or conductance distributions.

In some embodiments, the soft bit reference voltages are used to read data in the memory cells when the ECC engine is not able to decode a codeword stored in the memory cells using data sensed using the hard bit reference voltages. Typically, there is a set of soft bit reference voltages for each hard bit reference voltage. The soft bit reference voltages are reference voltages at slightly higher voltages and slightly lower voltages that a corresponding hard bit reference voltage. The set of soft bit reference voltages are used to generate "soft" reliability information, which increases the correction capability of the decoder. Sensing at the soft bit reference voltages generates "soft-bits", which indicate whether the physical parameter (e.g., Vt, resistance) of a memory cell close to the hard bit reference level making the hard bit for that memory cell less reliable, or far from the hard bit reference level making the hard bit more reliable. In other words, if the soft reliability information indicates that a memory cell has its value for a physical parameter (e.g., Vt, resistance) close to the hard bit reference level, then this is considered less reliable than if the soft reliability information indicates that a memory cell has its value for a physical parameter (e.g., Vt, resistance) far from the hard bit reference level.

Adjacent memory cell interference may result from parasitic cell effects due to continuous charge trap layers as well as electrostatic charge coupling between charge storage regions. Adjacent memory cell interference can cause errors during read operations. When an adjacent memory cell is in a higher level state with more electrons in the charge storage region, a lower level memory cell on the selected word line may be harder to turn on such that the parasitic cell results in higher word line interference. Additionally, the charge stored in a charge storage region of a memory cell can undergo an apparent shift because of electrical field coupling associated with charge stored at a neighboring memory cell's floating gate or other charge storage region (e.g., dielectric charge storage region). While the electric field from a charge on the floating gate of any memory cell in a memory array can couple to the floating gate of any other memory cell in the array, the effect is most pronounced and noticeable with adjacent memory cells. Adjacent memory cells may include neighboring memory cells that are on the same bit line as the target cell, neighboring memory cells on the same word line as the target cell, or neighboring memory cells that are on both a neighboring bit line and neighboring word line (to the BL and WL of the target cell), and thus, adjacent from each other in a diagonal direction. The apparent shift in charge can result in errors when reading the memory state of a target memory cell. In some embodiments, compensation is based on data states of memory cells that were already read; hence, the adjacent cells upon which compensation is based may be limited to adjacent cells previously read.

Figure 8:
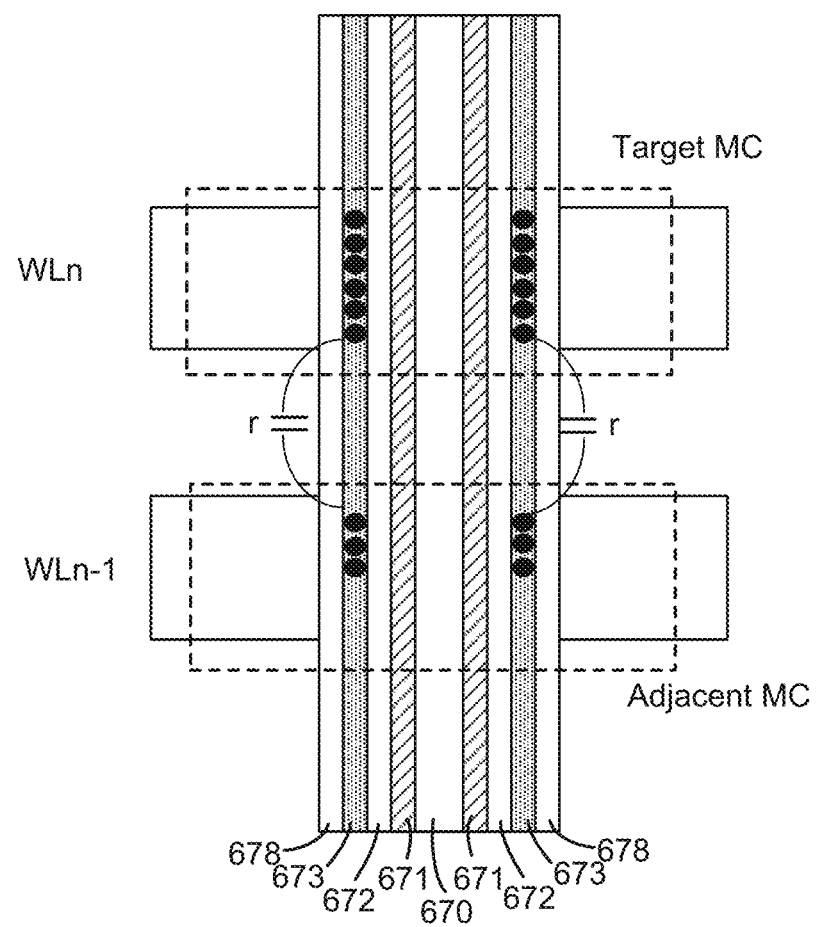
FIG. 8 graphically explains the concept of interference of an adjacent cell on a target cell.

FIG. 8 graphically explains the concept of interference on a target memory cell from an adjacent memory cell. FIG. 8 depicts a simplified view of FIG. 6D with exemplary adjacent word lines WLn−1 and WLn. In some embodiments, reading is sequential such that WLn−1 is read prior to WLn. Locations of a target memory cell (MC) and an adjacent MC are depicted. The memory hole MH includes inner core layer 670, channel layer 671, tunneling dielectric layer 672, charge trapping layer 673, and blocking layer 678. The target memory cell at WLn may experience interference r from the adjacent memory cell. The interference r represents electrostatic coupling between the electrons stored at WLn−1 and the electrons stored at WLn. When the memory cell at WLn−1 is at a higher state, more electrostatic coupling will result. In one embodiment, the interference r is the coupling ratio between the charge stored in the adjacent charge storage regions for WLn−1 and WLn. The interference r corresponds to the capacitance of the neighboring charge storage regions divided by the sum of all capacitive couplings of the charge storage region at WLn to all the other electrodes surrounding it. Note that the target memory cell may also experience interference from other adjacent cells. For example, the target memory cell may also experience from an adjacent cell on WLn+1. Also, adjacent cells on the neighboring memory holes can cause interference on the target cell.

One scheme for correction of coupling effects during read takes into account the condition (e.g., data state) of the adjacent memory cell on WLn−1 when reading the target memory cell on WLn. In one embodiment, compensation is effected by a choice of the read reference voltage applied the selected word line WLn, reducing or eliminating errors during reading the selected word line WLn. In one embodiment, the selected word line WLn is biased at multiple read reference voltages to provide for different levels of compensation. This could generate multiple sense results for each memory cell. Then, based on the state of the adjacent MC, one of the sense results is used and the others discarded.

Figure 9:
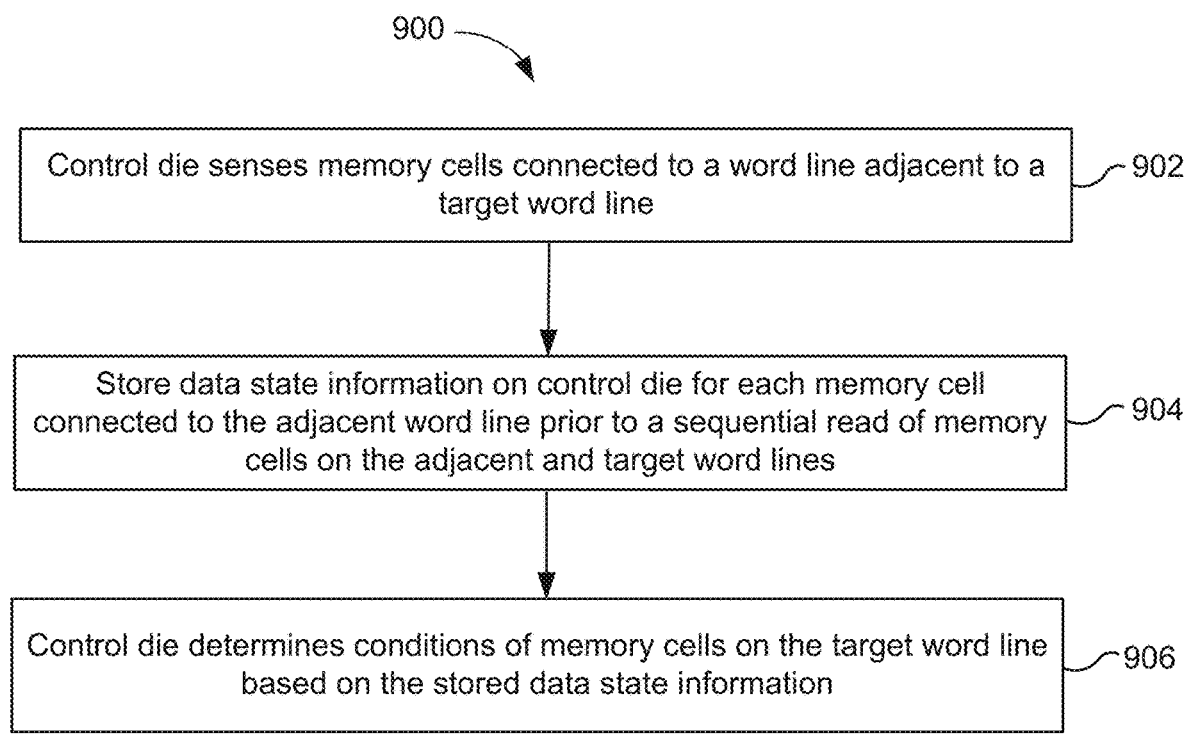
FIG. 9 depicts one embodiment of a flowchart of a process of using stored state information from an adjacent word line to determine conditions of memory cells on a target word line.

FIG. 9 depicts one embodiment of a flowchart of a process 900 of using stored state information from an adjacent word line to determine conditions of memory cells on a target word line. In one embodiment, process 900 is performed by control circuitry 310 on control die 304. Process 900 will focus on two of the word lines, which are referred to as an adjacent word line (e.g., WLn−1) and a target word line (e.g., WLn). The memory cells connected to the adjacent word lines may be referred to as adjacent memory cell. The memory cells connected to the target word line may be referred to as target memory cells. Process 900 is performed when reading a set of word lines in a block that includes reading the adjacent word line prior to reading the target word line. In one embodiment, the process 900 is performed in a sequential read in which the adjacent word line is read immediately before reading the target word line.

Step 902 includes the control die 304 sensing the adjacent memory cells connected to the adjacent word line. The sense amplifiers 350 are used to sense bit lines associated with the adjacent memory cells. The management circuitry 480 may determine hard bits for each adjacent memory cell, and store those hard bits in the latches 360.

Step 904 includes the control die 304 storing data state information on the control die for each memory cell connected to the adjacent word line. The management circuitry 480 may store the data state information in storage 392. In one embodiment, the data state information is stored prior to sensing the target word line in the set of reads of word lines in a block that contains the adjacent and target word lines. In one embodiment, the data state information is stored prior to sensing the target word line in the sequential read that reads the adjacent word line immediately prior to reading the target word line. In one embodiment, the data state information is stored prior to a failure to decode a codeword stored in the second memory cells.

Step 906 includes the control die 304 determining conditions of the target memory cells based on the stored data state information for the adjacent memory cells. In one embodiment, the adjacent memory cell for each respective target memory cell is on the same NAND string (see FIG. 8). In some embodiments, the data state information for more than one adjacent memory cell may be used in connection with a specific target memory cell.

The condition may include, but is not limited to, a data state (e.g., S0-S15 in FIG. 7), a hard bit, or a soft bit. The stored data state information may be used in a number of ways. In some embodiments, the stored data state information is used to compensate for interference of the adjacent memory cells on the target memory cells. In some embodiments, the stored data state information is used to select what read reference voltage is used for sensing a target memory cell. In some embodiments, the stored data state information is used to apply equalization to data sensed from the target memory cells.

Figure 10:
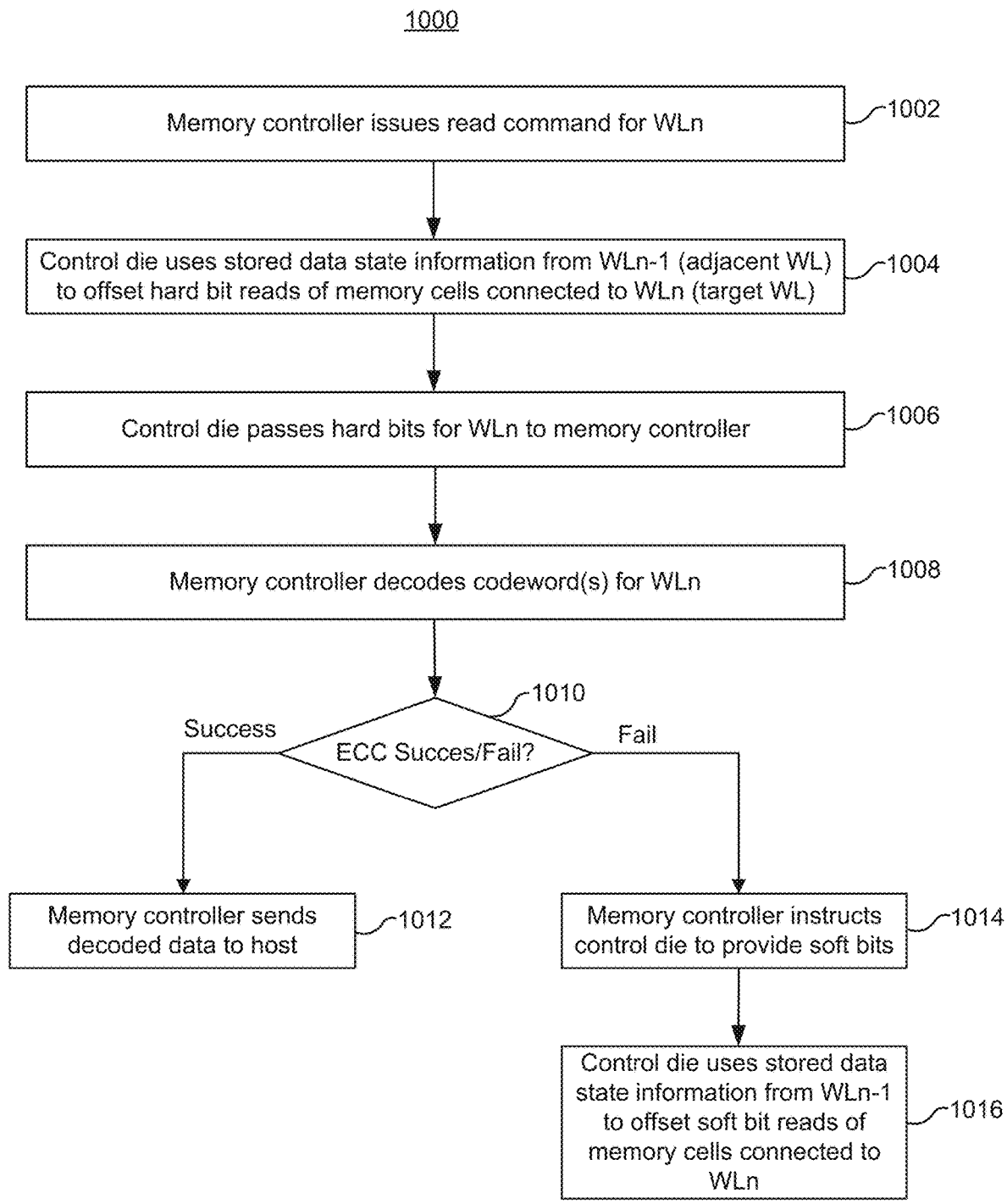
FIG. 10 is a flowchart of one embodiment of a process of using stored data state information to determine both a hard bit and a soft bit for each target memory cell.

In some embodiments, the stored data state information is used to determine both a hard bit and a soft bit for each target memory cell. This alleviates the potential to have to re-sense the adjacent memory cell multiple times to obtain the data state information. FIG. 10 is a flowchart of one embodiment of a process 1000 of using stored data state information to determine both a hard bit and a soft bit for each target memory cell.

Step 1002 includes the memory controller 102 issuing a read command for WLn (the target WL) to the control die 304. Step 1004 includes the control die 304 using stored data state information from WLn−1 (the adjacent WL) to offset hard bit read reference voltages when sensing target memory cells connected to WLn. Further details of using stored data state to offset hard bit read reference voltages are discussed in connection with FIG. 11.

Step 1006 includes the control die passing hard bits for WLn to the memory controller 102. The hard bits form one or more codewords.

Step 1008 includes the memory controller 102 decoding the codeword(s) for WLn. Step 1010 is a conditional whose outcome depends on whether the decoding was successful. If the codeword(s) for WLn were successfully decoded, then the memory controller 102 sends the data for the codeword(s) to the host 120, in step 1012. If the codeword(s) for WLn were not successfully decoded, then in step 1014 the memory controller 102 instructs the control die 304 to provide soft bits for memory cells connected to WLn.

Step 1016 includes the control die 304 using the stored data information from WLn−1 to offset soft bit read reference voltages when sensing the target memory cells connected to WLn. Further details of using stored data state to offset soft bit read reference voltages are discussed in connection with FIG. 12.

Figure 11:
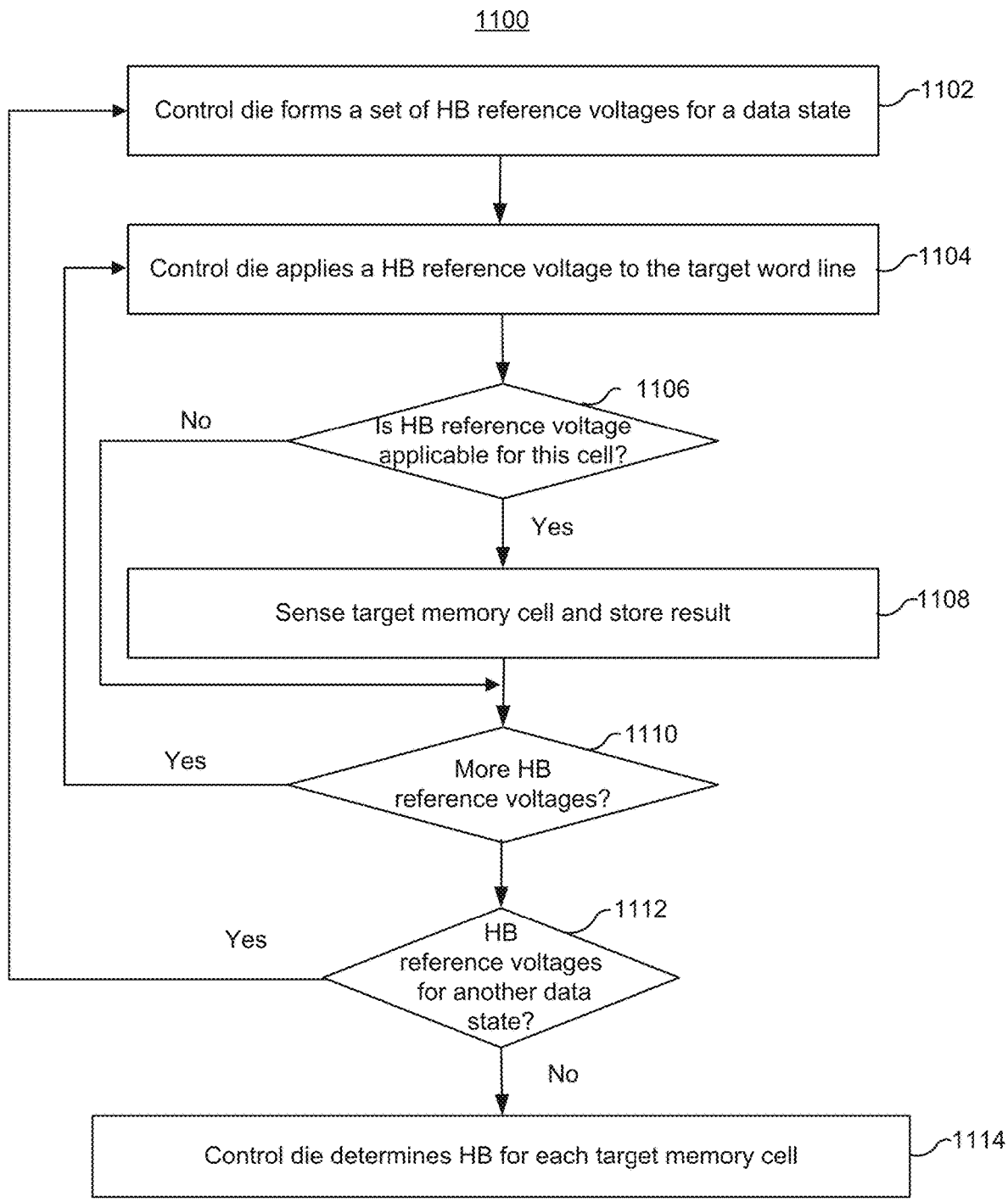
FIG. 11 is a flowchart of one embodiment of a process of reading memory cells in which the read reference voltages are based on the stored data state information.

In some embodiments, compensation based on the stored data state information includes applying a hard bit read reference voltage to a target memory cell that compensates for interference from an adjacent memory cell. FIG. 11 is a flowchart of one embodiment of a process 1100 of reading memory cells in which the HB read reference voltages are based on the stored data state information. The process 1100 is used to determine hard bits, and can be used in step 1004 of process 1000. The process 1100 can also be used in step 906 of process 900. Note that the steps in process 1100 are depicted in a certain order as a matter of convenience of explanation. In some cases, the steps could occur in a different order.

Step 1102 includes the control die 304 forming a set of HB reference voltages for a data state. Each HB reference voltage provide different amounts of adjacent data state compensation. For example, each HB reference voltage provide a different amount of compensation for interference of an adjacent cell on a target cell. The hard bit reference voltages will be discussed with respect to FIG. 7. In order to determine a hard bit for each memory cell, HB read reference voltages (e.g., Vr1, Vr4, Vr6, and Vr11) associated with different data states may be applied. However, step 1102 is directed to just one data state. The different HB read reference voltages in step 1102 may include an increase or decrease to the HB read reference voltage for a particular state (as well as no increase or decrease). For example, the voltages in step 1102 may include Vr1 and Vr1+Vcomp, where Vcomp may have a positive or a negative magnitude. In this example, Vcomp provides compensation for interference of an adjacent memory cell on a target memory cell. In step 1102, there may be more than two HB reference voltages. In one embodiment, the data state information includes two bits for each adjacent memory cell, in which case Vr1, Vr1+Vcomp1, Vr1+Vcomp2, and Vr1+Vcomp3 may be used in order to provide additional different levels of compensation. The data state information could include more than two bits per adjacent memory cell.

Step 1104 includes the control die 304 applying a HB read reference voltage to the target word line. Step 1106 is a determination of whether this HB reference voltage is applicable to this target memory cell. This determination is made based on the data state information for an adjacent memory cell. FIG. 8 depicts one example of a target memory cell on WLn and an adjacent memory cell on WLn−1. In one embodiment, the control die 304 accesses the data state information for the adjacent memory cell on WLn−1 (on the same NAND string as the target memory cell), which is used to determine whether the HB reference voltage is applicable. The determination could be based on more than one memory cell that is adjacent to the target memory cell. For example, the data state information from "diagonal" adjacent cells (on different NAND strings) that are associated with neighbor memory holes could be considered in step 1106.

If this HB reference voltage is applicable, then the target memory cell is sensed in step 1108. Also, a result of the sensing is stored. As noted in the discussion of FIG. 4, the trip latch 468 in a sense amplifier 350 may trip in response to applying the SB reference voltage. The processor 482 reads the trip latch 468 and may store the result. Thus, the control die 304 stores sense information for the target memory cell based on the data state of an adjacent memory cell. In one embodiment, processor 482 stores the sense information in a latch. In some cases, the latch could be one of the UDL, UMDL, LMDL, or LDL latches. However, the sense information can also be stored in a working latch. Note that optionally, the target memory could be sensed for all of the HB reference levels, with some of the sense information discarded. For example, the sense amplifier 350 could operate for all HB read reference voltages, but the processor 482 could ignore results that do not correspond to the desired level of compensation.

Step 1110 is a determination of whether there is another HB reference voltage for this data state. If so, the next HB reference voltage is applied in step 1104. This other HB reference voltage will provide a different level of compensation than others applied so far for this data state. As noted, in step 1108 it is possible to sense the target memory cells for more than one HB reference voltage for this data state. However, the sense information for only one of the HB reference voltages needs to be stored. That is, one of the HB reference voltage in step 1104 will provide the desired compensation for this target memory cell.

Step 1112 is a determination of whether there are HB reference voltages for another date state. As noted above, the process 1100 might apply HB reference voltages associated with S1, S4, S6, and S11 in different iterations of step 1104. After performing steps 1104-1112 for HB reference voltages for all relevant states for a HB, the control die 304 is able to finalize the determination of the HB for each target memory cell, in step 1114. Note that the procedure for determining the HB for each target memory cell may actually be performed as each bit of sense information is determined in step 1108. In one embodiment, the processor 482 uses two latches to store the sense information (that is kept in step 1108). The first bit of sense information may be placed into, for example, the UDL latch. The next bit of sense information (for the next data state) may be placed into a working latch. Then, an XOR (or other logical operation) may be performed on the sense information in the two latches, with the result placed in the UDL latch. The next bit of sense information (for the third data state) is placed into the working latch, with another XOR performed on the contents of the two latches. Again, the result is placed into the UDL latch. In the end of process 1100, the UDL latch contains the hard bit for the target memory cell for the lower page. Note that this process (or any other process that stores the HB for the lower page in the HDL latch) will over-write the contents of the UDL latch for a previous read operation. However, by saving the state information in, for example, storage 392, the state information for an adjacent memory cell remains available.

Figure 12:
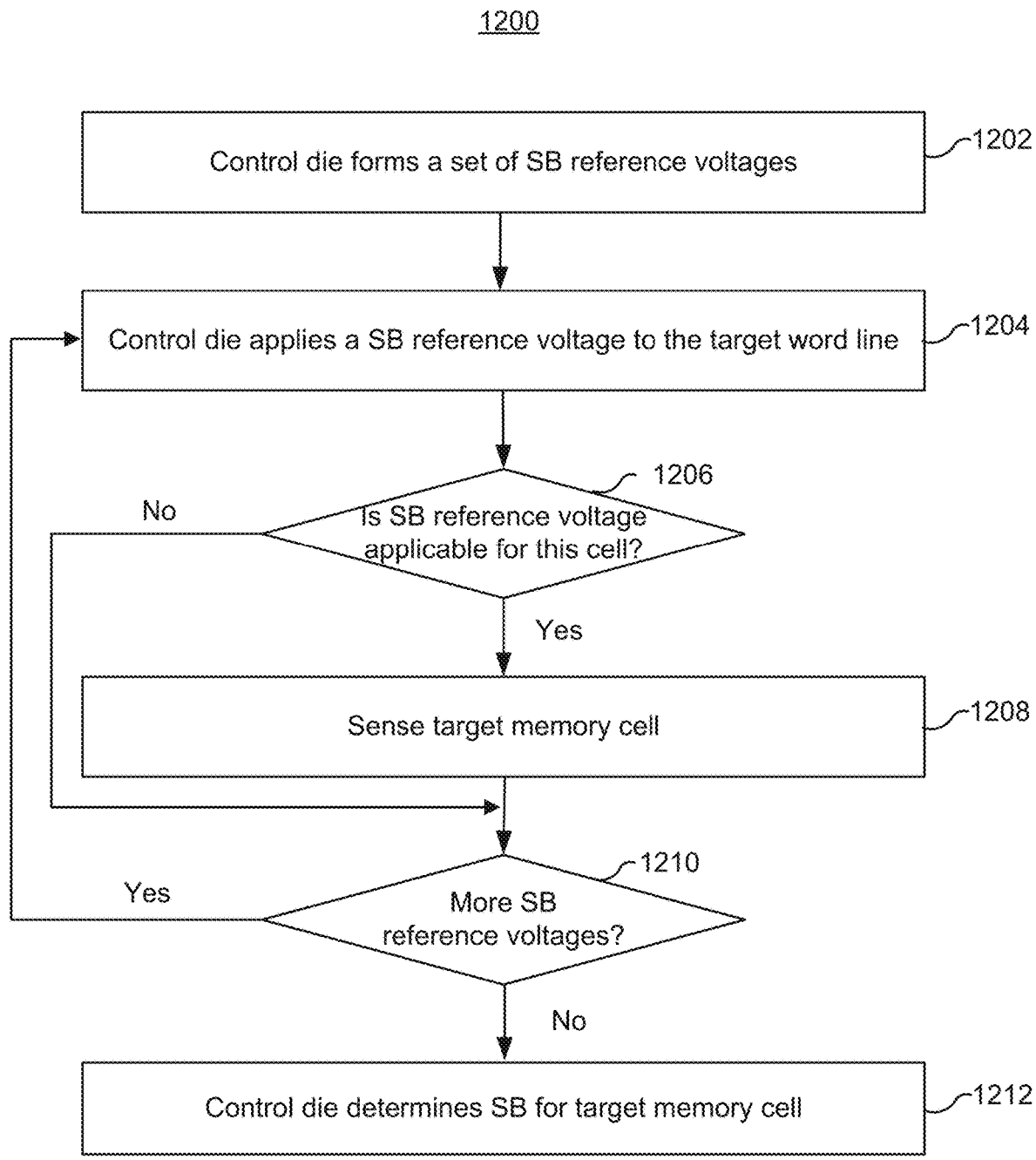
FIG. 12 is a flowchart of one embodiment of a process of reading soft bits from memory cells in which the soft bit reference voltages are based on the stored data state information.

In some embodiments, compensation based on the stored data state information includes applying a soft bit reference voltages to a target memory cell that compensates for interference from an adjacent memory cell. FIG. 12 is a flowchart of one embodiment of a process 1200 of reading soft bits from memory cells in which the soft bit reference voltages are based on the stored data state information. The process 1200 is used to determine soft bits for a target memory cell, and can be used in step 1016 of process 1000. The process 1200 can also be used in step 906 of process 900. The process is described in terms of a single target memory cell, but may be performed in parallel for all target memory cells connected to the target word line. Note that the steps in process 1200 are depicted in a certain order as a matter of convenience of explanation. In some cases, the steps could occur in a different order.

Step 1202 includes the control die 304 forming a set of SB reference voltages. The discussion of process 1200 will focus on applying SB reference levels associated with Vr1 (see, FIG. 7). If no compensation were applied, then the set Vr1_s1, Vr1_s2, Vr1, Vr1_s3, and Vr1_s4 may be applied to the target word line. In one embodiment, this set is augmented by adding Vcomp to each of these voltages. Depending on the magnitude of Vcomp, this could result in some duplicate magnitude voltages; however, duplicate magnitudes are not included in the set. The set of SB references voltages will contain some voltages that are applicable to the target memory cell and some that are not applicable.

Step 1204 includes the control die 304 applying one of the SB reference voltages to the target word line. Step 1206 is a determination of whether this SB reference voltage is applicable to this target memory cell. If this SB reference voltage is applicable, then the target memory cell is sensed in step 1208. As noted in the discussion of FIG. 4, the trip latch 468 in a sense amplifier 350 may trip in response to applying the SB reference voltage. The processor 482 reads the trip latch 468 and may store the result.

Step 1210 includes a determination of whether there are more SB reference voltages to apply to the target word line. If so, the next SB reference voltage is applied to the target word line in step 1204. After all SB reference voltages have been applied (step 1210 is no), then the control die 1212 determines the SB for the target memory cell.

Figure 13A:
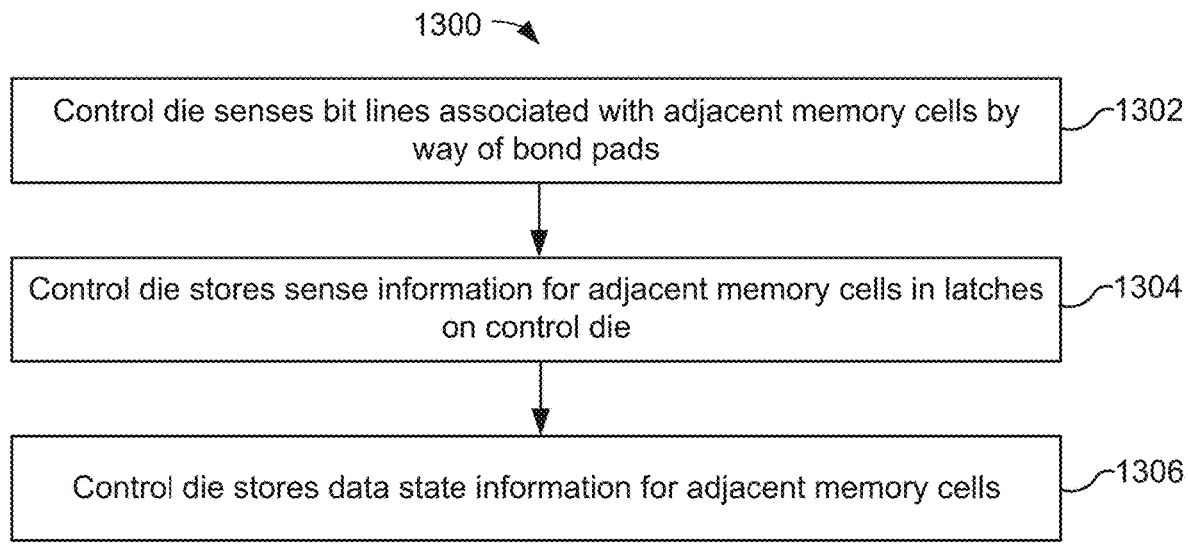
FIG. 13A is a flowchart depicting one embodiment of a process of storing data state information for adjacent memory cells.

As noted herein, results from sensing memory cells may be stored in data latches. The following describes one embodiment of sensing adjacent memory cells and storing data state information for the adjacent memory cells, and provides further details for operating the data latches. FIG. 13A is a flowchart depicting one embodiment of a process 1300 of storing data state information for adjacent memory cells. The process 1300 provides further details for an embodiment of steps 902 and 904 of process 900. In some embodiments, the control die 304 is bonded to the memory die 302 by way of bond pads 570, 574 (see FIGS. 5A, 5B). Some of the bond pads are connected to bit lines in a memory structure 326 in the memory die 302.

Step 1302 includes the control die 304 sensing bit lines associated with adjacent memory cells by way of bond pads. For example, some of the pathways 352 (see FIG. 3A) connect to bit lines in the memory structure 326 to allow the bit lines to be sensed by the read/write circuits 328.

Step 1304 includes the control die 304 storing sense information for the adjacent memory cells into latches on the control die 304. As one example, management circuitry 480 stores hard bits for the adjacent memory cells in the latches 360 (see FIG. 3B). As another example, processor 482 stores hard bits for one of the adjacent memory cells latches 484. In this example, four hard bits are stored for each memory cell. The UDL latch stores the HB for the lower page, with other latches each storing a hard bit for a different page.

Step 1306 includes the control die 304 storing data state information for the adjacent memory cells. The data state information may be stored in storage 392. In one embodiment, the data state information includes at least one bit for each adjacent memory cell. The data state information is based on what data state the adjacent memory cell resides. For example, in the 16 data state (or four HB) example, the adjacent memory cell resides in one of S0-S15. One option is to record the four hard bits, which will thus specify one of the 16 data states. However, it is not required that the data state information specify the exact data state. In one embodiment, the data state information includes a single bit, which indicates which of two sets of data states the cell resides. Typically each set is a contiguous set of data states. For example, a bit value of "0" could specify S0-S7 and a bit value of "1" could specify S8-S15. As another example, a bit value of "0" could specify S0-S11 and a bit value of "1" could specify S12-S15. Hence, the sets do not need to be the same size. In these examples a data state information value of "0" may correspond to no compensation, whereas a data state information value of "1" may correspond to some level of compensation. The data state information could contain one, two, three, or four bits in this example in which there are 16 data states. Thus, with two bits, "00" may correspond to no compensation, whereas "01", "10" and "11" may correspond to three different levels of compensation.

Figure 13B:
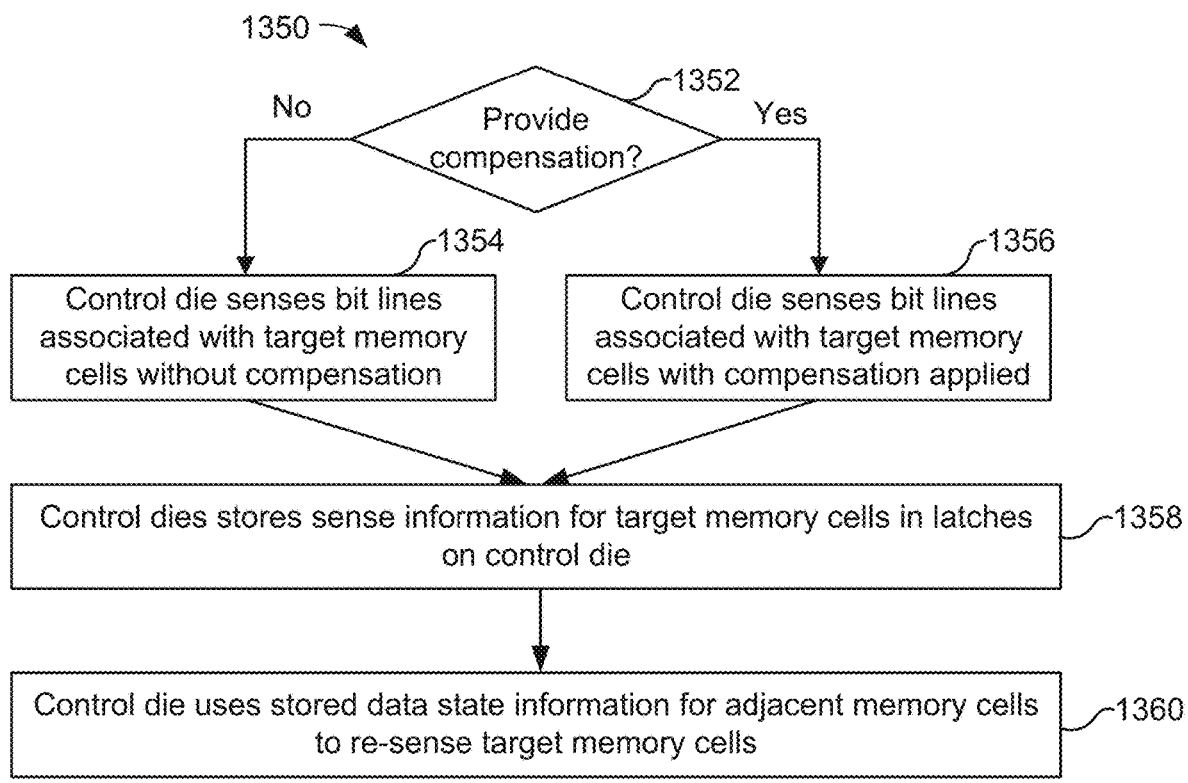
FIG. 13B is a flowchart depicting one embodiment of a process of using the data state information to provide compensation to the target memory cells.

FIG. 13B is a flowchart depicting one embodiment of a process 1350 of using the data state information to provide compensation to the target memory cells. The process 1350 provides further details for an embodiment of step 906 of process 900. In one embodiment, process 1350 is performed following process 1300 during a sequential read.

Step 1352 includes a determination of whether to use compensation when sensing the target memory cells to determine hard bits. Using the compensation can help to reduce the error rate, and increase the probability that the codeword is successfully decoded. However, not using the compensation can simplify the sensing operation. The sensing operation can be faster and use less power if compensation is not used. The decision of whether to use compensation may be based on an error rate of memory cells already read in the block, or on the memory die.

Step 1354 includes the control die 304 sensing the bit lines associated with the target memory cells without applying compensation. For example, rather than applying multiple HB read reference voltages for a data state, only one HB read reference voltage is applied for a data state, thereby saving time and power. As with step 1302, the sensing may be by way of bond pads.

Step 1356 includes the control die 304 sensing bit lines associated with target memory cells. As with step 1302, the sensing may be by way of bond pads. The saved data state information may be used as described in process 1100. Hence, multiple HB reference voltages that provide different levels of compensation are applied to the target WL.

Step 1358 is performed following either step 1354 or 1356. Step 1358 includes the control die 304 storing sense information for the target memory cells into latches on the control die 304. This step may be similar to step 1304. Note that the sense information for the target memory cells may over-write the sense information that was stored in the latches for the adjacent memory cell during process 1300.

Step 1360 includes the control die 304 using the stored data state information for the adjacent memory cells to re-sense the target memory cell. In one embodiment, step 1356 senses hard bits and step 1360 senses soft bits in response to a decoding failure (see process 1000). In one embodiment, step 1354 senses hard bits and step 1360 also senses hard soft bits in response to a decoding failure. Note that regardless of which of step 1354 or 1356 was performed, the information in the data latches from the adjacent memory cells was over-written in step 1358. However, the saved state information for the adjacent memory cells is still available. As noted herein, due to space limitations, saving such state information may be impractical in a design in which the memory cells and chip-level control circuits are on the same die.

There are numerous different types of compensation that may be provided to the target memory cells, based on the data states of the adjacent memory cells. Already discussed above is compensation in the form of the magnitude of a read reference voltage (HB or SB) applied to the target word line. In one embodiment, the compensation is in the form of the equalization of data read from the target memory cells. The equalization may be used to compensate for interference of the adjacent memory cells on the target memory cells.

Figure 14:
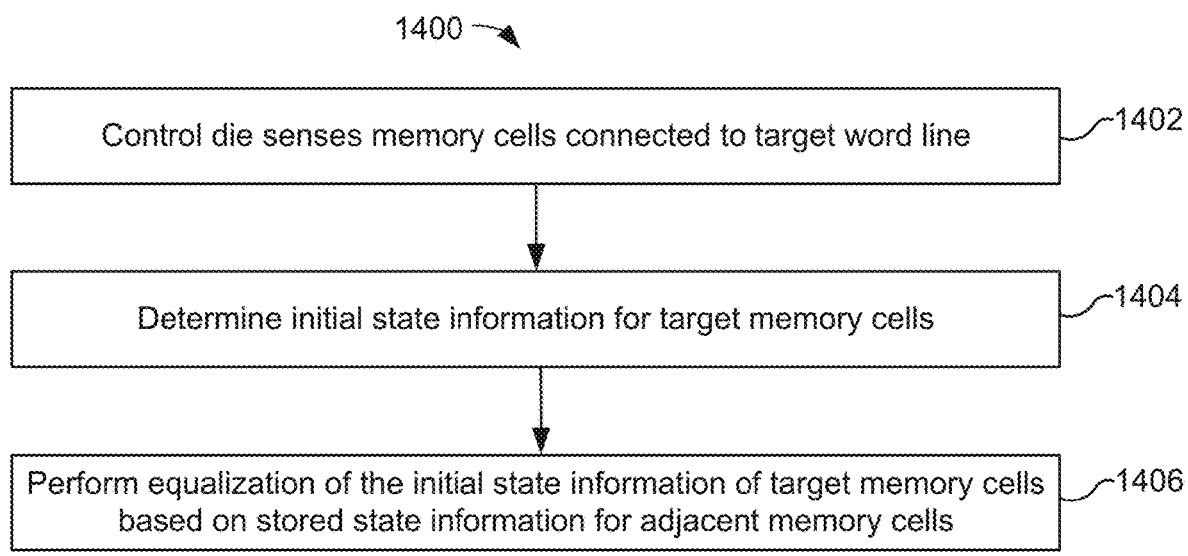
FIG. 14 is a flowchart of one embodiment of a process of applying equalization of data read from the target memory cells.

FIG. 14 is a flowchart of one embodiment of a process 1400 of applying equalization of data read from the target memory cells. Process 1400 may be used in step 906 of process 900. Hence, prior to process 1400 the memory cells on the adjacent word lines have been read, and the data state information for the adjacent memory cells has been stored.

Step 1402 includes the control die 304 sensing memory cells connected to the target word line. Step 1404 includes the control die 304 determining initial state information for the target memory cells. Step 1404 may include the control die 304 determine one or more raw codewords for data stored in the target memory cells.

Step 1406 includes the control die 304 performing equalization based on the stored data state information. In one embodiment, the equalization uses Linear Minimal Mean Square Error (LMMSE) cross-coupling estimation and equalization. This technique is based on second order statistics of the target cells and the adjacent cells, specifically the covariance matrix of read threshold voltages of the adjacent cells and on the cross-correlation vector of the target cells and their adjacent cells. The equalization technique includes determining the extent to which an adjacent cell (or adjacent cells) disturbs the reading of a target cell based on a linear model of the disturbing (such as an LMMSE). Then, an estimate may be made of data that was actually stored in the target cell based on the actual sensing (e.g., steps 1402-1404) and the extent to which the adjacent cell(s) disturbs the reading of the target cell. Further details of performing such equalization are described in U.S. Pat. No. 7,751,237 to Alrod et al., titled "Post-Facto Correction for Cross Coupling in Flash Memory," which is hereby incorporated by reference. Note that the equalization in step 1406 is performed after sensing the data in the target cells and does not require that any compensation be applied to perform the sensing of the target cells.

In view of the above, it can be seen that a first embodiment includes an apparatus, comprising storage and a control circuit connected to the storage. The control circuit is configured to connect to a memory die comprising first non-volatile memory cells connected to a first word line in a block and second non-volatile memory cells connected to a second word line in the block adjacent to the first word line. The control circuit is configured to sense the first memory cells. The control circuit is configured to store, into the storage, data state information for each of the first memory cells based on sensing the first memory cells. The storing occurs prior to sensing the second memory cells in a set of reads of word lines in the block. The control circuit is configured to determine conditions of the second non-volatile memory cells based on the stored data state information.

In a second embodiment, and in furtherance of the first embodiment, the control circuit is further configured to use the stored data state information to determine a hard bit for each of the second memory cells. The control circuit is further configured to use the stored data state information to determine a soft bit for each of the second memory cells in response to a decoding error with respect to the hard bits for the second memory cells.

In a third embodiment, and in furtherance of the first or second embodiment, the storage comprises data latches. The control circuit is further configured to store first sense information from sensing the first memory cells into the data latches. The control circuit is further configured to store second sense information from sensing the second memory cells into the data latches thereby overwriting the first sense information. The control circuit is further configured to use the stored data state information for the first memory cells to determine the conditions of the second non-volatile memory cells after overwriting the first sense information.

In a fourth embodiment, and in furtherance of the third embodiment, the control circuit and the storage reside on a control die that is bonded to the memory die. The memory die comprises bit lines associated with the first memory cells and with the second memory cells. The control circuit is further configured to sense the first memory cells and the second memory cells by sensing the bit lines.

In a fifth embodiment, and in furtherance of any of the first to fourth embodiments, the control circuit is further configured to determine the condition of a selected memory cell connected to the second word line based on a reference voltage applied to the selected memory cell, wherein the reference voltage provides compensation for interference on the selected memory cell that corresponds to the stored data state information for an adjacent memory cell to the selected memory cell.

In a sixth embodiment, and in furtherance of any of the first to fifth embodiments, the control circuit and the storage reside on a control die that is affixed to the memory die. The control circuit is further configured to sense the second memory cells connected to the second word line and transfer sense information from sensing the second memory cells from the memory die to the storage. The control circuit is further configured to use the stored data state information to perform equalization of the sense information in the storage. The equalization compensates for interference of the first memory cells on the second memory cells. The control circuit is further configured to determine data states of the second memory cells based on the equalization.

In a seventh embodiment, and in furtherance of any of the first to sixth embodiments, the control circuit is further configured to determine a hard bit for each of the second memory cells based on the stored data state information and transfer the hard bit for each second memory cell to a memory controller. The control circuit is further configured to provide soft bits to the memory controller in response to a request from the memory controller for the soft bits. To provide the soft bits, the control circuit is further configured to apply soft bit read reference voltages to the second word line; sense each second non-volatile memory cell in response to application of the soft bit read references voltages, wherein soft bit sense data is generated for each second memory cell for each of the soft bit read references voltages; use the stored data state information for a first memory cell adjacent to a respective second memory cell to select which soft bit sense data to use for each respective second memory cell; and determine the soft bit for each of the second memory cells based on the selected soft bit sense data for each respective second memory cell.

In an eighth embodiment, and in furtherance of any of the first to seventh embodiments, the control circuit is configured to store, into the storage, the data state information for each of the first memory cells prior to a failure to decode a codeword stored in the second memory cells. The control circuit is configured to determine the conditions of the second non-volatile memory cells based on the stored data state information in response to the failure to decode the codeword stored in the second memory cells.

In a ninth embodiment, and in furtherance of any of the first to eighth embodiments, the control circuit is configured to read the first word line immediately prior to reading the second word line in the reads of the word lines in the block.

One embodiment includes a method comprising sensing first non-volatile memory cells connected to a first word line. The first non-volatile memory cells and the first word line reside on a memory die that is affixed to a control die. The sensing is controlled by a control circuit on the control die. The method comprises storing first sense information for each respective first memory cell into data latches on the control die based on sensing the first memory cells. The method comprises storing data state information on the control die for each respective first memory cell based on the first sense information in the data latches prior to sensing second non-volatile memory cells connected to a second word line adjacent to the first word line in a sequential read of the first and second word lines. The data state information for each respective first memory cell specifies a set of one of more data states in which the respective first memory cell resides. The method comprises compensating for interference of the first memory cells on the second non-volatile memory cells based on the stored data state information. The method comprises determining data states of the second non-volatile memory cells as a result of the compensation.

One embodiment includes a non-volatile storage system, comprising a memory die and a control die bonded to the memory die by way of bond pads. The memory die comprises non-volatile memory cells, a plurality of word lines connected to the memory cells, and bit lines associated with the memory cells. The control die comprises sensing means for sensing bit lines associated with first non-volatile memory cells by way of the bond pads. The first non-volatile memory cells are connected to a first word line of the plurality of word lines. The control die comprises data state storage means for storing data state information for each of the first memory cells prior to a failure to decode a codeword stored in second memory cells connected to a second word line adjacent to the first word line. The data state information is based on the sensing and specifies a range of one of more data states in which the respective first memory cell resides. The control die comprises compensation means for applying data state dependent compensation to the second memory cells based on the stored data state information.

In embodiments, the sensing means comprises one or more of state machine 312, address decoders 314, power control 316, read/write circuits 328, sense block 340, sense amplifiers 350, sense circuitry 460, sense node 464, comparison circuit 466, and/or trip latch.

In embodiments, the data state storage means comprises one or more of management circuitry 480, processor 482, storage 392, state machine 312, a PGA (Programmable Gate Array, FPGA (Field Programmable Gate Array), ASIC (Application Specific Integrated Circuit), integrated circuit or other type of circuit.

In embodiments, the compensation means for applying data state dependent compensation to the second memory cells based on the stored data state information comprises one or more of state machine 312, ECC engine 330, power control 316, read/write circuits 328, sense amplifiers 350, management circuitry 480, a processor, PGA (Programmable Gate Array, FPGA (Field Programmable Gate Array), ASIC (Application Specific Integrated Circuit), integrated circuit or other type of circuit. In embodiments, the compensation means for applying data state dependent compensation to the second memory cells based on the stored data state information performs process 1100. In embodiments, the compensation means for applying data state dependent compensation to the second memory cells based on the stored data state information performs process 1200.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
    storage, wherein the storage comprises data latches and data state information storage; and
    a control circuit connected to the storage, the control circuit configured to connect to a memory die comprising first non-volatile memory cells connected to a first word line in a block and second non-volatile memory cells connected to a second word line in the block adjacent to the first word line, the control circuit configured to:
    sense the first memory cells;
    store first sense information from sensing the first memory cells into the data latches;
    store, into the data state information storage, data state information for each of the first memory cells based on the first sense information from sensing the first memory cells in the data latches, the storing occurs prior to sensing the second memory cells in a set of reads of word lines in the block;
    sense the second memory cells;
    store second sense information from sensing the second memory cells into the data latches thereby overwriting the first sense information; and
    determine conditions of the second non-volatile memory cells based on the stored data state information, including use the stored data state information for the first memory cells to determine the conditions of the second non-volatile memory cells after overwriting the first sense information.

2. The apparatus of claim 1, wherein the control circuit is further configured to:
    use the stored data state information to determine a hard bit for each of the second memory cells; and
    use the stored data state information to determine a soft bit for each of the second memory cells in response to a decoding error with respect to the hard bits for the second memory cells.

3. The apparatus of claim 1, wherein:
    the control circuit and the storage reside on a control die that is bonded to the memory die;
    the memory die comprises bit lines associated with the first memory cells and with the second memory cells; and
    the control circuit is further configured to sense the first memory cells and the second memory cells by sensing the bit lines.

4. The apparatus of claim 1, wherein the control circuit is further configured to:
    determine the condition of a selected memory cell connected to the second word line based on a reference voltage applied to the selected memory cell, wherein the reference voltage provides compensation for interference on the selected memory cell that corresponds to the stored data state information for an adjacent memory cell to the selected memory cell.

5. The apparatus of claim 1, wherein the control circuit and the storage reside on a control die that is affixed to the memory die, wherein the control circuit is further configured to:
    determine initial state information from the second sense information;
    use the stored data state information to perform equalization of the initial state information, wherein the equalization compensates for interference of the first memory cells on the second memory cells; and
    determine data states of the second memory cells based on the equalization.

6. The apparatus of claim 1, wherein the control circuit is further configured to:
    determine a hard bit for each of the second memory cells based on the stored data state information;
    transfer the hard bit for each second memory cell to a memory controller;
    provide soft bits to the memory controller in response to a request from the memory controller for the soft bits, comprising:
        apply soft bit read reference voltages to the second word line;
        sense each second non-volatile memory cell in response to application of the soft bit read references voltages, wherein soft bit sense data is generated for each second memory cell for each of the soft bit read references voltages;
        use the stored data state information for a first memory cell adjacent to a respective second memory cell to select which soft bit sense data to use for each respective second memory cell; and
        determine the soft bit for each of the second memory cells based on the selected soft bit sense data for each respective second memory cell.

7. The apparatus of claim 1, wherein the control circuit is configured to:
    store, into the data state information storage, the data state information for each of the first memory cells prior to a failure to decode a codeword stored in the second memory cells; and
    determine the conditions of the second non-volatile memory cells based on the stored data state information in response to the failure to decode the codeword stored in the second memory cells.

8. The apparatus of claim 1, wherein the control circuit is configured to read the first word line immediately prior to reading the second word line in the reads of the word lines in the block.

9. A method comprising:
sensing first non-volatile memory cells connected to a first word line, the first non-volatile memory cells and the first word line reside on a memory die that is affixed to a control die, the sensing controlled by a control circuit on the control die;
storing first sense information for each respective first memory cell into data latches on the control die based on sensing the first memory cells;
storing data state information in data state information storage on the control die for each respective first memory cell based on the first sense information in the data latches prior to sensing second non-volatile memory cells connected to a second word line adjacent to the first word line in a sequential read of the first and second word lines, the data state information for each respective first memory cell specifies a set of one of more data states in which the respective first memory cell resides;
compensating for interference of the first memory cells on the second memory cells based on the stored data state information after over-writing the first sense information in the data latches with second sense information of the second memory cells; and
determining data states of the second memory cells as a result of the compensation.

10. The method of claim 9, wherein compensating for interference of the first memory cells on the second memory cells based on the stored data state information comprises:
applying different hard bit read reference voltages to the second word line to test for whether respective second memory cells have a threshold voltage above or below a hard bit reference level, wherein each of the different hard bit read reference voltages applies a different amount of compensation; and
sensing each respective second memory cell for one of the different hard bit read reference voltages that is based on the stored data state information;
wherein the second sense information in the data latches corresponds to a hard bit read reference voltage that provides an amount of compensation that corresponds to the interference caused by an adjacent first memory cell to the respective second memory cell.

11. The method of claim 10, wherein compensating for interference of the first memory cells on the second memory cells based on the stored data state information further comprises:
applying different soft bit read reference voltages to the second word line to test for whether respective second memory cells have a threshold voltage above or below a soft bit reference level, wherein each of the different soft bit read reference voltages applies a different amount of compensation;
sensing each respective second memory cell for a subset of the different soft bit read reference voltages that is based on the stored data state information; and
storing third sense information for each respective second memory cell into the data latches on the control die based on sensing the second memory cells, wherein the third sense information over-writes the second sense information, wherein the stored third sense information corresponds to a subset of the soft bit read reference voltages that provide an amount of compensation that corresponds to the interference caused by the adjacent first memory cell to the respective second memory cell.

12. The method of claim 9, wherein compensating for interference of the first memory cells on second memory cells based on the stored data state information comprises:
determine initial state information from the second sense information of the second memory cells; and
performing equalization, based on the stored data state information, on the initial state information that provides an amount of compensation for each respective second memory cell that corresponds to the interference caused by an adjacent first memory cell to the respective second memory cell.

13. A non-volatile storage system, comprising:
a memory die comprising non-volatile memory cells, a plurality of word lines connected to the memory cells, and bit lines associated with the memory cells; and
a control die bonded to the memory die by way of bond pads, wherein the control die comprises:
sensing means for sensing bit lines by way of the bond pads, the bit lines associated with first non-volatile memory cells connected to a first word line of the plurality of word lines;
data state storage means for storing data state information for each of the first memory cells prior to a failure to decode a codeword stored in second memory cells connected to a second word line adjacent to the first word line, the data state information based on the sensing and specifying a range of one of more data states in which the respective first memory cell resides; and
compensation means for applying data state dependent compensation to the second memory cells based on the stored data state information.

14. The non-volatile storage system of claim 13, wherein the compensation means is configured to:
use the stored data state information to determine a hard bit for each of the second memory cells, the hard bits for the second memory cells forming the codeword; and
use the stored data state information to determine a soft bit for each of the second memory cells in response to a failure to successfully decode the codeword.

15. The non-volatile storage system of claim 14, wherein the data state storage means is configured to:
store first data states of the first memory cells into data latches on the control die; and
over-write the first data states of the first memory cells in the data latches with second data states of the second memory cells when using the stored data state information to determine a hard bit for each of the second memory cells.

16. The non-volatile storage system of claim 14, wherein:
the compensation means is configured to apply different hard bit read reference voltages to the second memory cells, wherein each of the different hard bit read reference voltages applies a different amount of data state dependent compensation;
the sensing means is configured to provide sense information for each respective second memory cell for at least a hard bit read reference voltage that provides compensation for interference from an adjacent first memory cell to the respective second memory cell; and
the compensation means is configured to use the sense information that provides compensation for interference from the adjacent first memory cell to the respective second memory cell to determine a condition of the respective second memory cell.

17. The non-volatile storage system of claim 13, wherein:
the compensation means is further configured to apply different soft bit reference voltages to the second memory cells;
the sensing means is configured to generate sense information for each respective second memory cell for at least a set of the soft bit reference voltages that provide compensation for interference from an adjacent first memory cell to the respective second memory cell; and
the compensation means is configured to use the sense information for the set of the soft bit reference voltages that provide compensation for interference from the adjacent first memory cell to the respective second memory cell to determine a condition of the respective second memory cell.

18. The non-volatile storage system of claim 13, wherein:
the data state storage means is configured to store first data states of the first memory cells into data latches on the control die, and over-write the first data states of the first memory cells in the data latches with second data states of the second memory cells; and
the compensation means for applying state dependent compensation to the first memory cells is configured to perform equalization on the second data states that provides an amount of state dependent compensation for each respective second memory cell that corresponds to data state of an adjacent first memory cell to the respective second memory cell after over-writing the first data states of the first memory cells in the data latches with second data states of the second memory cells.

19. A non-volatile storage system, comprising:
storage, wherein the storage comprises data latches and data state information storage; and
a control circuit connected to the storage, the control circuit configured to connect to a memory die comprising first non-volatile memory cells connected to a first word line in a block and second non-volatile memory cells connected to a second word line in the block adjacent to the first word line, the control circuit configured to:
sense the first memory cells;
store, into the data state information storage, data state information for each of the first memory cells based on sensing the first memory cells, the storing occurs prior to sensing the second memory cells in a set of reads of word lines in the block and prior to a failure to decode a codeword stored in the second memory cells; and
determine conditions of the second non-volatile memory cells based on the stored data state information in response to the failure to decode the codeword stored in the second memory cells.

20. A non-volatile storage system, comprising:
a memory die comprising non-volatile memory cells, a plurality of word lines connected to the memory cells, and bit lines associated with the memory cells; and
a control die bonded to the memory die by way of bond pads, wherein the control die comprises storage and a control circuit in communication with the storage and with the memory die, wherein the storage comprises data latches and data state information storage, wherein the control circuit is configured to:
sense first memory cells connected to a first word line in a block on the memory die;
store, into the data state information storage, data state information for each of the first memory cells based on sensing the first memory cells, the storing occurs prior to sensing second memory cells connected to a second word line in the block in a set of reads of word lines in the block;
sense the second memory cells connected to the second word line;
transfer sense information from sensing the second memory cells from the memory die to the storage;
determine initial state information for the second memory cells from the sense information in the data state information storage; and
use the stored data state information for the first memory cells to perform equalization of the initial state information for the second memory cells, wherein the equalization compensates for interference of the first memory cells on the second memory cells; and
determine data states of the second memory cells based on the equalization.

* * * * *